(12) United States Patent
Lin et al.

(10) Patent No.: US 9,190,393 B1
(45) Date of Patent: *Nov. 17, 2015

(54) LOW PARASITIC CAPACITANCE SEMICONDUCTOR DEVICE PACKAGE

(71) Applicant: DELTA ELECTRONICS, INC., Taoyuan Hsien (TW)

(72) Inventors: Li-Fan Lin, Taoyuan Hsien (TW); Wen-Chia Liao, Taoyuan Hsien (TW)

(73) Assignee: DELTA ELECTRONICS, INC. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/333,795

(22) Filed: Jul. 17, 2014

Related U.S. Application Data

(63) Continuation-in-part of application No. 14/185,322, filed on Feb. 20, 2014, now Pat. No. 8,957,493.

(30) Foreign Application Priority Data

Sep. 10, 2013 (TW) .............................. 102132512 A
Apr. 21, 2014 (TW) .............................. 103114340 A

(51) Int. Cl.
| | | |
|---|---|---|
| *H01L 29/78* | (2006.01) | |
| *H01L 29/20* | (2006.01) | |
| *H01L 25/07* | (2006.01) | |
| *H01L 23/495* | (2006.01) | |
| *H01L 23/522* | (2006.01) | |
| *H01L 29/423* | (2006.01) | |
| *H01L 29/417* | (2006.01) | |
| *H01L 27/088* | (2006.01) | |

(52) U.S. Cl.
CPC ........ *H01L 25/072* (2013.01); *H01L 23/49562* (2013.01); *H01L 23/49575* (2013.01); *H01L 23/5226* (2013.01); *H01L 29/41725* (2013.01); *H01L 29/4232* (2013.01); *H01L 27/0883* (2013.01)

(58) Field of Classification Search
None
See application file for complete search history.

(56) References Cited

U.S. PATENT DOCUMENTS

| | | | |
|---|---|---|---|
| 6,255,679 B1 * | 7/2001 | Akiba ........................... | 257/284 |
| 7,432,133 B2 | 10/2008 | Condie et al. | |
| 8,901,653 B2 * | 12/2014 | Hashimoto ................... | 257/342 |
| 8,957,493 B1 * | 2/2015 | Lin et al. ...................... | 257/459 |
| 2007/0187780 A1 * | 8/2007 | Tiemeijer ...................... | 257/401 |
| 2009/0242946 A1 * | 10/2009 | Yamamura .................... | 257/288 |
| 2012/0112819 A1 * | 5/2012 | Greenberg et al. ........... | 327/537 |
| 2012/0199905 A1 * | 8/2012 | Nitta ............................. | 257/343 |
| 2012/0273849 A1 * | 11/2012 | Adamski ....................... | 257/288 |
| 2015/0102408 A1 * | 4/2015 | Nitta ............................. | 257/343 |

FOREIGN PATENT DOCUMENTS

| | | |
|---|---|---|
| CN | 1464551 | 12/2003 |
| CN | 101924079 | 12/2010 |

* cited by examiner

*Primary Examiner* — Joseph Schoenholtz
(74) *Attorney, Agent, or Firm* — Hauptman Ham, LLP

(57) ABSTRACT

A semiconductor device package includes a substrate, a transistor, and a lead frame disposed on a side of the substrate opposite to the transistor. The transistor is disposed on the substrate, and includes an active layer, a source electrode, a drain electrode, a gate electrode, a first insulating layer, a first source pad, a first drain pad, a source plug, and a drain plug. The source and the drain electrodes are disposed on the active layer. An orthogonal projection of the source electrode on the active layer forms a source region. The first insulating layer covers at least a portion of the source electrode and at least a portion of the drain electrode. The first source pad and the first drain pad are disposed on the first insulating layer. An orthogonal projection of the first source pad on the active layer forms a source pad region overlaps the drain region.

36 Claims, 18 Drawing Sheets

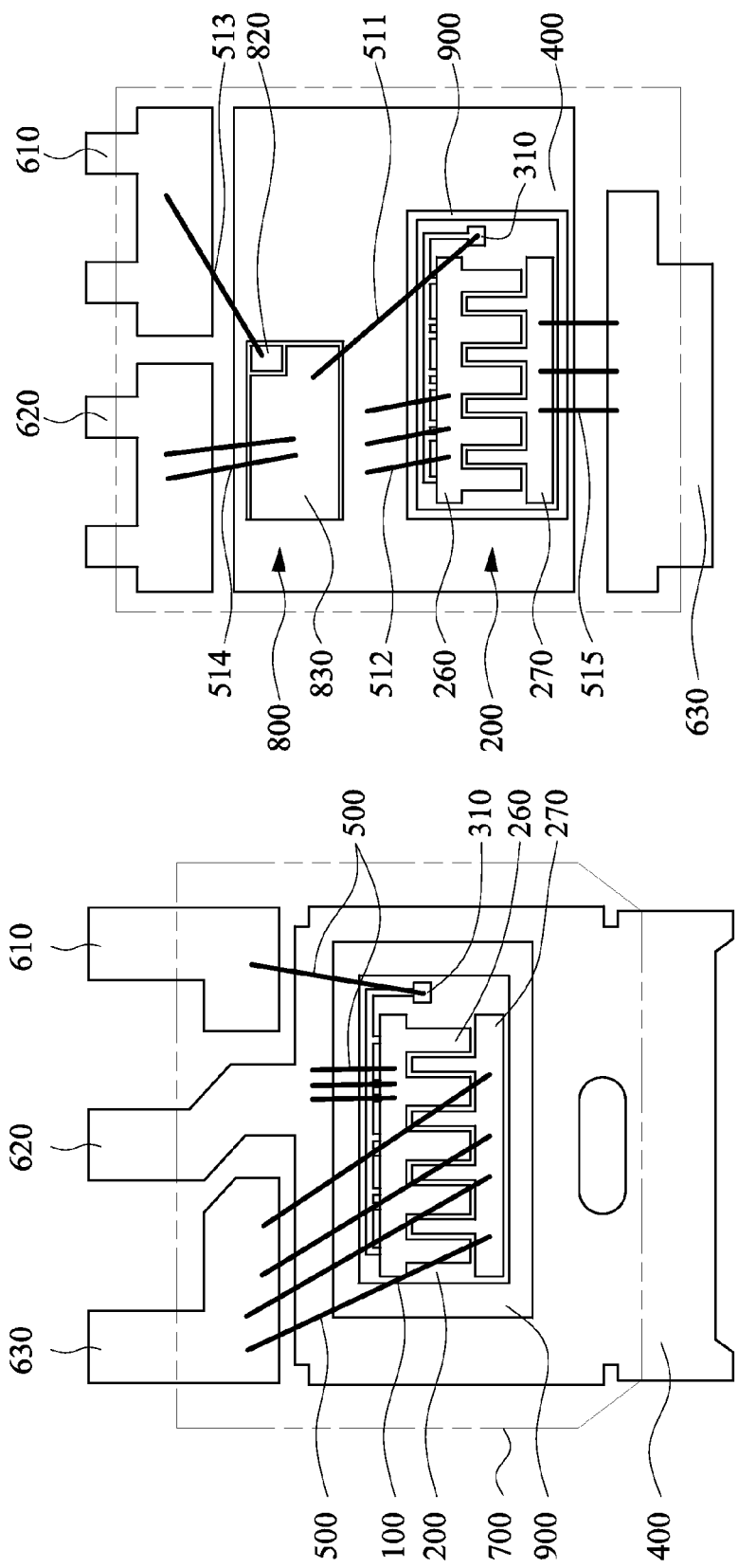

LOW PARASITIC CAPACITANCE SEMICONDUCTOR DEVICE PACKAGE

RELATED APPLICATIONS

The present application is a continuation-in-part application of U.S. application Ser. No. 14/185,322, filed Feb. 20, 2014, and claims priority to Taiwan Application Serial Number 102132512, filed Sep. 10, 2013; and Taiwan Application Serial Number 103114340, filed Apr. 21, 2014, which are herein incorporated by reference.

BACKGROUND

1. Field of Invention

The present invention relates to a semiconductor device package.

2. Description of Related Art

A field effect transistor is a switch device, which controls a current flowing through it with an electric field generated in a material layer, widely utilized in circuits made up of semiconductor devices. In particular, the field effect transistor includes a gate electrode, a source electrode, a drain electrode, and an active layer. The source electrode and the drain electrode are located at opposite sides of the active layer. By controlling the voltage applied to the gate electrode, the electric field in the active layer is affected to allow current to flow from the source electrode to the drain electrode. As a result, the field effect transistor is in an on state.

Generally speaking, a field effect transistor may further include a source pad and a drain pad, which are electrically connected to the source electrode and the drain electrode respectively, to allow the field effect transistor to be electrically connected to another device. The source pad and the drain pad usually have large bonding areas to facilitate the bonding of external circuits. The progress in semiconductor processing facilitates the miniaturization of field effect transistors. It is essential to provide a well-placed source pad and drain pad with adequate bonding areas and less electrical interference on the field effect transistor itself.

Moreover, in a package structure of the field effect transistor, an improper packaging may increase the parasitic capacitance of the field effect transistor and reduce the efficiency of the field effect transistor. Hence, the package design of the field effect transistor is an area undergoing development in the art.

SUMMARY

An aspect of the present invention is to provide a semiconductor device package including a substrate, a transistor, and a lead frame. The transistor is disposed on the substrate, and the transistor includes an active layer, at least one source electrode, at least one drain electrode, at least one gate electrode, a first insulating layer, a first source pad, a first drain pad, at least one source plug, and at least one drain plug. The source electrode is disposed on the active layer. An orthogonal projection of the source electrode on the active layer forms a source region. The drain electrode is disposed on the active layer. The drain electrode is separated from the source electrode, and an orthogonal projection of the drain electrode on the active layer forms a drain region. The gate electrode is disposed on the active layer and between the source electrode and the drain electrode. The first insulating layer covers at least a portion of the source electrode and at least a portion of the drain electrode. The first insulating layer has at least one source via hole and at least one drain via hole therein. The first source pad is disposed on the first insulating layer. An orthogonal projection of the first source pad on the active layer forms a source pad region. The source pad region overlaps at least a portion of the drain region, and an area of overlapping region between the source pad region and the drain region is smaller than or equal to 40% of an area of the drain region. The first drain pad is disposed on the first insulating layer. The source plug is filled in the source via hole and is electrically connected to the first source pad and the source electrode. The drain plug is filled in the drain via hole and is electrically connected to the first drain pad and the drain electrode. The lead frame is disposed on a side of the substrate opposite to the transistor and is electrically connected to the gate electrode.

In one or more embodiments, the semiconductor device package further includes a gate pin, a source pin, and a drain pin. The gate pin is electrically connected to the lead frame and the gate electrode. The source pin and the drain pin are respectively electrically connected to the source electrode and the drain electrode, and both of the source pin and the drain pin are electrically insulated with the lead frame.

In one or more embodiments, the semiconductor device package further includes an inter-insulating layer disposed between the lead frame and the substrate.

In one or more embodiments, a parasitic capacitance between the substrate and the lead frame is smaller than a parasitic capacitance between the substrate and the transistor.

Another aspect of the present invention is to provide a semiconductor device package including a substrate, the transistor mentioned above, and a lead frame. The transistor is disposed on the substrate. The lead frame is disposed on a side of the substrate opposite to the transistor and is electrically insulated with the gate electrode, the source electrode, and the drain electrode.

In one or more embodiments, the semiconductor device package further includes a gate pin, a source pin, and a drain pin respectively electrically connected to the gate electrode, the source electrode, and the drain electrode.

Yet another aspect of the present invention is to provide a semiconductor device package including a substrate, the transistor mentioned above, a lead frame, and an inter-insulating layer. The transistor is disposed on the substrate. The lead frame is disposed on a side of the substrate opposite to the transistor and is electrically connected to the source electrode or the drain electrode. The inter-insulating layer is disposed between the lead frame and the substrate.

In one or more embodiments, the semiconductor device package further includes a gate pin, a source pin, and a drain pin. The gate pin is electrically connected to the gate electrode. The source pin and the drain pin are respectively electrically connected to the source electrode and the drain electrode, and one of the source pin and the drain pin is electrically connected to the lead frame.

In one or more embodiments, a parasitic capacitance between the substrate and the lead frame is smaller than a parasitic capacitance between the substrate and the transistor.

Yet another aspect of the present invention is to provide a substrate, the transistor mentioned above, and a lead frame. The transistor is disposed on the substrate. The transistor is electrically connected to the lead frame using a flip-chip configuration. The lead frame includes a first portion, a second portion, and a third portion. The first portion is electrically connected to the gate electrode. The second portion is electrically connected to the source electrode. The third portion is electrically connected to the drain electrode.

In one or more embodiments, the transistor is a depletion mode transistor. The semiconductor device package further includes an enhancement mode transistor electrically connected to the depletion mode transistor.

In one or more embodiments, the source electrode of the depletion mode transistor is electrically connected to a drain electrode of the enhancement mode transistor.

In one or more embodiments, the gate electrode of the depletion mode transistor is electrically connected to a source electrode of the enhancement mode transistor.

In one or more embodiments, an orthogonal projection of the first drain pad of the transistor on the active layer forms a drain pad region, the drain pad region overlaps at least a portion of the source region, and an area of overlapping region between the drain pad region and the source region is smaller than or equal to 40% of an area of the source region.

In one or more embodiments, the transistor further includes a gate dielectric layer, an interlayer dielectric, an inter-gate layer, and at least one first inter-gate plug. The gate dielectric layer is disposed at least between the gate electrode and the active layer. The interlayer dielectric covers the gate dielectric layer. The interlayer dielectric has at least one first inter-gate via hole. The inter-gate layer is disposed between the interlayer dielectric and the first insulating layer. The first inter-gate plug is filled in the first inter-gate via hole and is electrically connected the inter-gate layer and the gate electrode.

In one or more embodiments, orthogonal projections of the first source pad, the first drain pad, and the inter-gate layer on the active layer are separated from each other.

In one or more embodiments, an orthogonal projection of the gate electrode on the active layer overlaps at least one of orthogonal projections of the first source pad and the first drain pad on the active layer.

In one or more embodiments, an area of overlapping region between the orthogonal projections of the gate electrode and one of the orthogonal projections of the first source pad and the first drain pad on the active layer is smaller than 10% of an area of the orthogonal projection of the gate electrode on the active layer.

In one or more embodiments, the interlayer dielectric includes an upper dielectric portion and a lower dielectric portion. The upper dielectric portion has at least one second inter-gate via hole. The lower dielectric portion is disposed between the upper dielectric portion and the gate dielectric layer. The transistor further includes a metal layer and at least one second inter-gate plug. The metal layer is disposed between the upper dielectric portion and the lower dielectric portion, and an orthogonal projection of the metal layer on the active layer overlaps an orthogonal projection of the inter-gate layer on the active layer. The second inter-gate plug is filled in the second inter-gate via hole and is electrically connected the inter-gate layer and the metal layer.

BRIEF DESCRIPTION OF THE DRAWINGS

FIG. 11 is a top view of a semiconductor device package according to yet another embodiment of the present invention;

FIG. 12 is a top view of a semiconductor device package according to yet another embodiment of the present invention;

DETAILED DESCRIPTION

Figure 1:
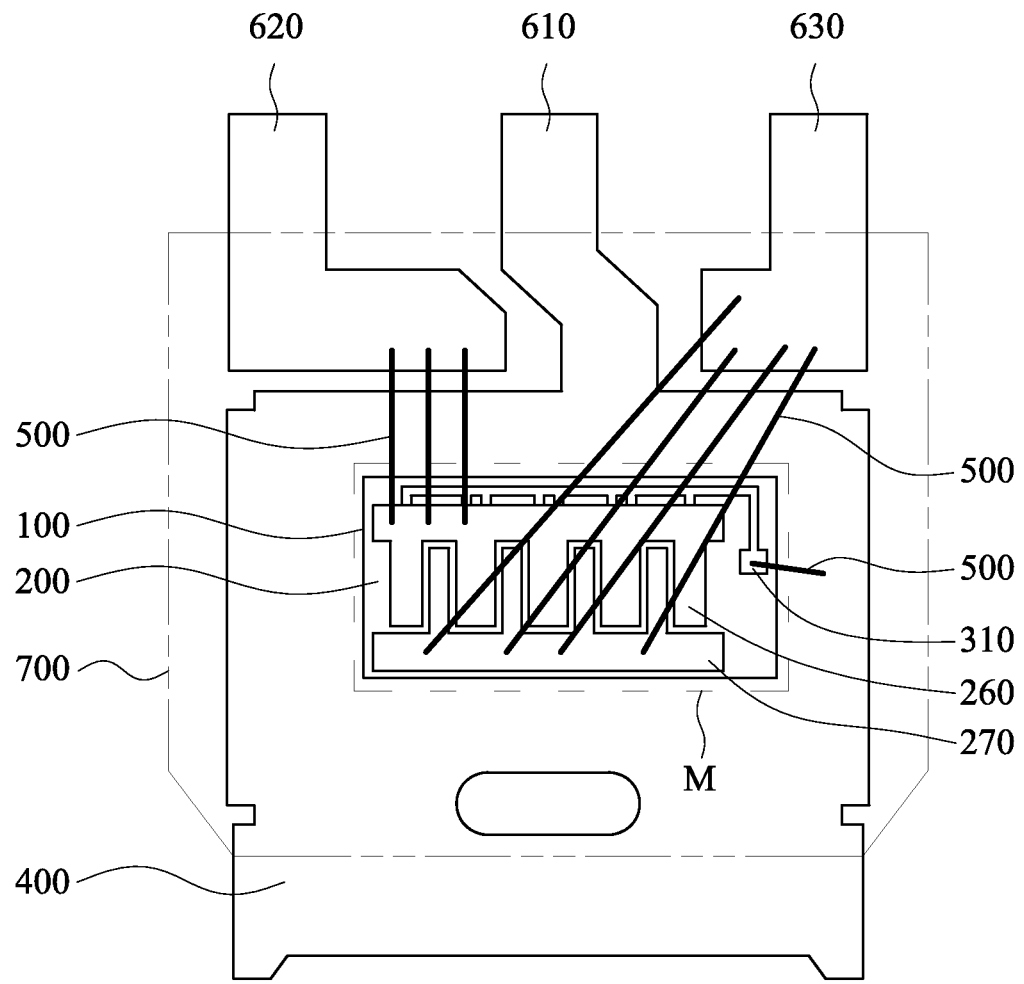
FIG. 1 is a top view of a semiconductor device package according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a top view of a semiconductor device package according to one embodiment of the present invention. The semiconductor device package includes a substrate 100, a transistor 200, and a lead frame 400. The transistor 200 is disposed on or above the substrate 100. The lead frame 400 is disposed on a side of the substrate 100 opposite to the transistor 200 and is electrically connected to a gate electrode of the transistor 200. The lead frame 400 may be made of copper plate, and the substrate 100 may be a silicon substrate or a sapphire substrate, and the claimed scope is not limited in this respect.

Figure 2:
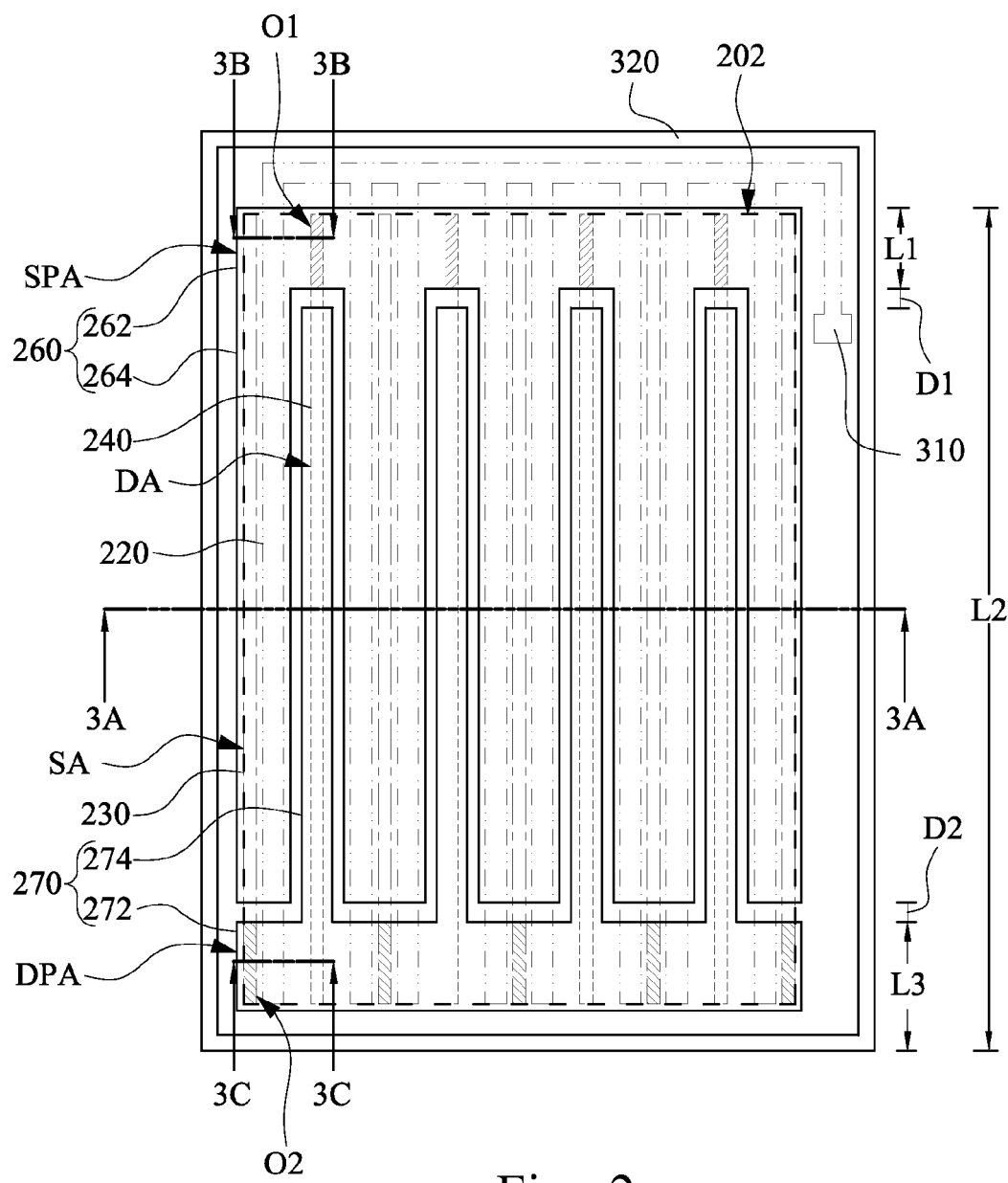
FIG. 2 is an enlarged diagram of area M in FIG. 1.
Figure 3A:
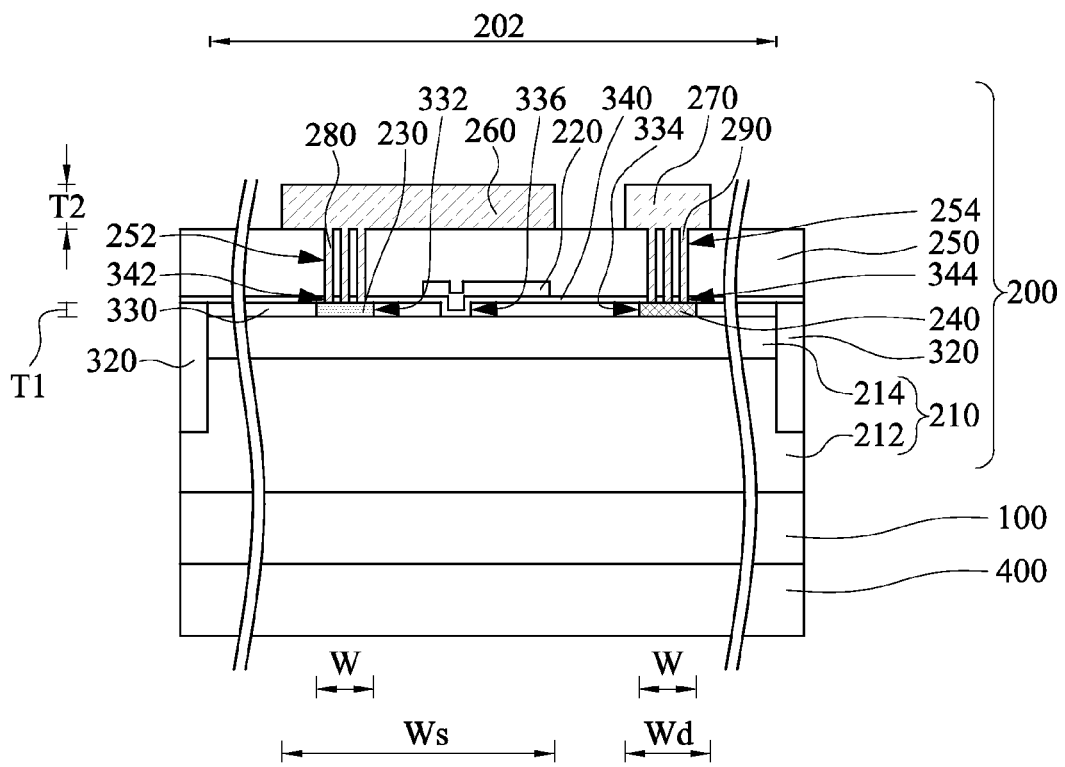
FIG. 3A is a cross-sectional view taken along 3A-3A of FIG. 2.

FIG. 2 is an enlarged diagram of area M in FIG. 1, and FIG. 3A is a cross-sectional view taken along 3A-3A of FIG. 2. The transistor 200 includes an active layer 210, at least one gate electrode 220, at least one source electrode 230, at least one drain electrode 240, a first insulating layer 250, a first source pad 260, a first drain pad 270, at least one source plug 280, and at least one drain plug 290. The source electrode 230 is disposed on the active layer 210. An orthogonal projection of the source electrode 230 on the active layer 210 forms a source region SA. The drain electrode 240 is disposed on the active layer 210. The drain electrode 240 is separated from the source electrode 230, and an orthogonal projection of the drain electrode 240 on the active layer forms a drain region DA. The gate electrode 220 is disposed on or above the active layer 210 and between the source electrode 230 and the drain electrode 240. The first insulating layer 250 at least covers a portion of the source electrode 230 and a portion of the drain electrode 240. In the embodiment of FIG. 3A, the first insulating layer 250 covers the gate electrode 220, the source electrode 230, and the drain electrode 240. Reference is made to FIGS. 1 and 2. The transistor 200 can further includes a gate pad 310 electrically connected to a plurality of the gate electrodes 220, such that the gate electrodes 220 can be electrically connected to the lead frame 400 via the gate pad 310. For example, the gate pad 310 can be connected to the lead frame 400 via a conductive element 500 such as a bonding wire, a ribbon, a clip, etc. The conductive elements in this article can be the bonding wire, the ribbon, the clip, etc mentioned above.

Reference is made to FIGS. 2 and 3A. The first insulating layer 250 has at least one source via hole 252, which may be formed in the shape of a circle, a rectangle, a polygon, an arc, or their combinations according to manufacturing requirements. The first source pad 260 is disposed on the first insulating layer 250. An orthogonal projection of the first source pad 260 on the active layer 210 forms a source pad region SPA. The source pad region SPA overlaps at least a portion of the drain region DA, and an area of an overlapping region O1 between the source pad region SPA and the drain region DA is smaller than or equal to 40% of an area of the drain region DA. For example, in FIG. 2, the overlapping region O1 has a length L1 and the drain electrode 240 has a length L2, and the length L1 is less than or equal to 40% of the length L2. The source plug 280 is filled in the source via hole 252 and is electrically connected to the first source pad 260 and the source electrode 230.

Furthermore, the first insulating layer 250 further has at least one drain via hole 254 therein. The first drain pad 270 is disposed on the first insulating layer 250. An orthogonal projection of the first drain pad 270 on the active layer 210 forms a drain pad region DPA. The drain pad region DPA overlaps at least a portion of the source region SA, and an area of an overlapping region O2 between the drain pad region DPA and the source region SA is smaller than or equal to 40% of an area of the source region SA. For example, in FIG. 2, the overlapping region O2 has a length L3 and the source electrode 230 has the length L2, and the length L3 is less than or equal to 40% of the length L2. The drain plug 290 is filled in the drain via hole 254 and is electrically connected to the first drain pad 270 and the drain electrode 240. For the sake of clarity, it is noted that both the source plug 280 and the drain plug 290 are only depicted in the cross-sectional view and not in the top view.

Reference is made to FIGS. 1-3A. The semiconductor device package of the present invention can reduce the parasitic capacitance generated between the source electrode 230 and the drain electrode 240 of the transistor 200, reduce the capacitance (Cds) between the source electrode 230 and the drain electrode 240, and reduce the size of the transistor 200. Firstly, since the lead frame 400 is electrically connected to the gate 220 of the transistor 200, the parasitic capacitance (especially the capacitance Cds) between the lead frame 400 and the active layer 210 of the transistor 200 is not increased. In addition, the overlapping region O1 is formed between the source pad region SPA and the drain region DA, and the overlapping region O2 is formed between the drain pad region DPA and the source region SA. The area of the overlapping region O1 is smaller than or equal to 40% of the area of the drain region DA, and the area of the overlapping region O2 is smaller than or equal to 40% of the area of the source region SA, the parasitic capacitances (especially the capacitance Cds) generated between the first source pad 260 and the drain electrode 240 and between the first drain pad 270 and the source electrode 230 are effectively reduced. In another embodiment of the present invention, the area of the overlapping region O1 is greater than 1% of the area of the drain region DA and smaller than 20% of the area of the drain region DA. The area of the overlapping region O2 is greater than 1% of the area of the source region SA and smaller than 20% of the area of the source region SA. Furthermore, at least a portion of the first source pad 260 is above the drain electrode 240 and at least a portion of the first drain pad 270 is above the source electrode 230. With this configuration, the size of the transistor 200 can shrink to increase the area utilization ratio of the active layer 210.

Reference is made to FIGS. 1 and 2. The semiconductor device package can further include a gate pin 610, a source pin 620, and a drain pin 630. The gate pin 610 is electrically connected to the lead frame 400 and the gate electrode 220. In the embodiment of FIG. 1, the gate pin 610 is connected to the lead frame 400, and the lead frame 400 is electrically connected to the gate electrode 220 through a conductive element 500 and the gate pad 310. The source pin 620 is electrically connected to the source electrode 230. For example, the source pin 620 can be electrically connected to the source electrode 230 through a conductive element 500 and the first source pad 260. The drain pin 630 is electrically connected to the drain electrode 240. For example, the drain pin 630 can be electrically connected to the drain electrode 240 through a conductive element 500 and the first drain pad 270. The source pin 620 and the drain pin 630 are both electrically insulated with the lead frame 400.

Moreover, the semiconductor device package can further include a package material 700 covering the substrate 100, the transistor 200, the lead frame 400, the conductive elements 500, a portion of the gate pin 610, a portion of the source pin 620, and a portion of the drain pin 630, and exposing another portion of the gate pin 610, another portion of the source pin 620, and another portion of the drain pin 630. For clarity, the package material 700 in FIG. 1 is depicted with dashed lines. The package material 700 protects the transistor 200, and the semiconductor device package can be electrically connected to other devices through the exposed portions of the gate pin 610, the source pin 620, and the drain pin 630.

The following paragraphs provide detailed explanations with respect to the transistor 200. Reference is made to FIG. 2. In greater detail, in the present embodiment, the first source pad 260 includes a source pad body 262 and at least one source pad branch 264. An elongation direction of the source pad body 262 is approximately perpendicular to an elongation direction of the source electrode 230, and an elongation direction of the source pad branch 264 is approximately parallel to the elongation direction of the source electrode 230. An orthogonal projection of the source pad body 262 on the active layer 210 (see FIG. 3A) overlaps at least a portion of the drain region DA, such as the overlapping region O1 in FIG. 2. The first drain pad 270 includes a drain pad body 272 and at least one drain pad branch 274. An elongation direction of the drain pad body 272 is approximately perpendicular to an elongation direction of the drain electrode 240, and an elongation direction of the drain pad branch 274 is approximately parallel to the elongation direction of the drain electrode 240. The drain pad body 272 is separated from the source pad body 262. An orthogonal projection of the drain pad body 272 on the active layer 210 overlaps at least a portion of the source region SA, such as the overlapping region O2 in FIG. 2. The source pad branch 264 extends from the source pad body 262 toward the drain pad body 272. The drain pad branch 274 extends from the drain pad body 272 toward the source pad body 262. In another embodiment of the present invention, in addition to being strip-shaped, the source pad branch 264 may be wave-shaped, zigzag-shaped, irregularly shaped, or some combination thereof, and the source pad branch 264 extends from the source pad body 262 toward the drain pad body 272. Similarly, a shape of the drain pad branch 274 may be different depending on product design, and the drain pad branch 274 extends from the drain pad body 272 toward the source pad body 262.

Reference is made to FIGS. 2 and 3A. In greater detail, an orthogonal projection of the source pad branch 264 on the active layer 210 overlaps at least a portion of the source electrode 230. Hence, the source plugs 280 may be disposed between the source pad branch 264 and the source electrode 230 to provide an adequate electrical connection between the first source pad 260 and the source electrode 230. As a result, a resistance value of the source electrode 230 itself is improved. In addition, when a resistance value of the source pad branch 264 per unit length is smaller than a resistance value of the source electrode 230 per unit length (for example in FIG. 3A, a thickness T2 of the first source pad 260, i.e., a thickness of the source pad branch 264, is greater than a thickness T1 of the source electrode 230), the resistance value of the source electrode 230 itself is also improved.

In addition, an orthogonal projection of the drain pad branch 274 on the active layer 210 overlaps at least a portion of the drain electrode 240. Hence, the drain plugs 290 may be disposed between the drain pad branch 274 and the drain electrode 240 to provide an adequate electrical connection between the first drain pad 270 and the drain electrode 240. As a result, a resistance value of the drain electrode 240 itself is improved. In addition, when a resistance value of the drain pad branch 274 per unit length is smaller than a resistance value of the drain electrode 240 per unit length (for example in FIG. 3A, a thickness T2 of the first drain pad 270, i.e., a thickness of the drain pad branch 274 is greater than a thickness T1 of the drain electrode 240), the resistance value of the drain electrode 240 itself is also improved.

Figure 3B:
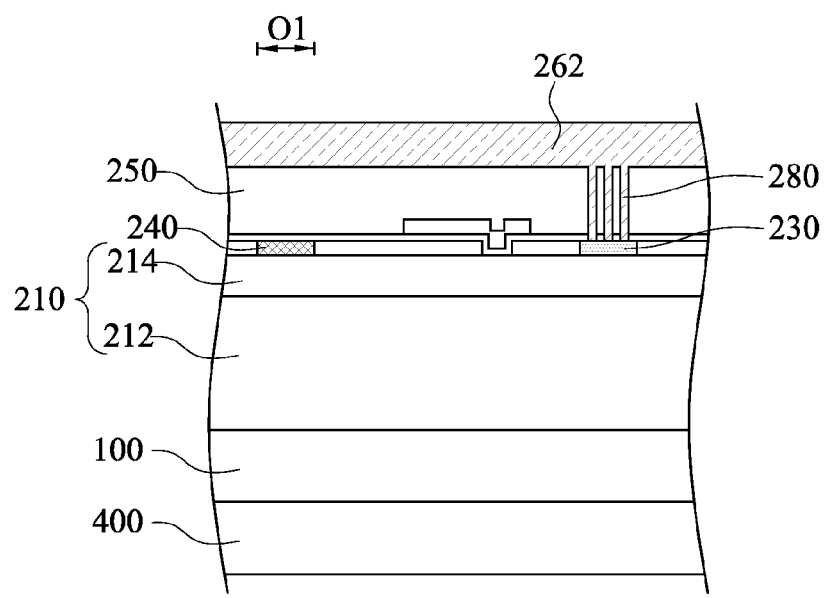
FIG. 3B is a cross-sectional view taken along 3B-3B of FIG. 2.

FIG. 3B is a cross-sectional view taken along line 3B-3B of FIG. 2. The source plugs 280 may be disposed between the source pad body 262 and the source electrode 230 to provide an adequate electrical connection between the source pad body 262 and the source electrode 230. In addition, because the source pad body 262 is electrically isolated with the drain electrode 240, no plug exists between the source pad body 262 and the drain electrode 240 (that is, the portion of the first insulating layer 250 above the overlapping region O1).

Figure 3C:
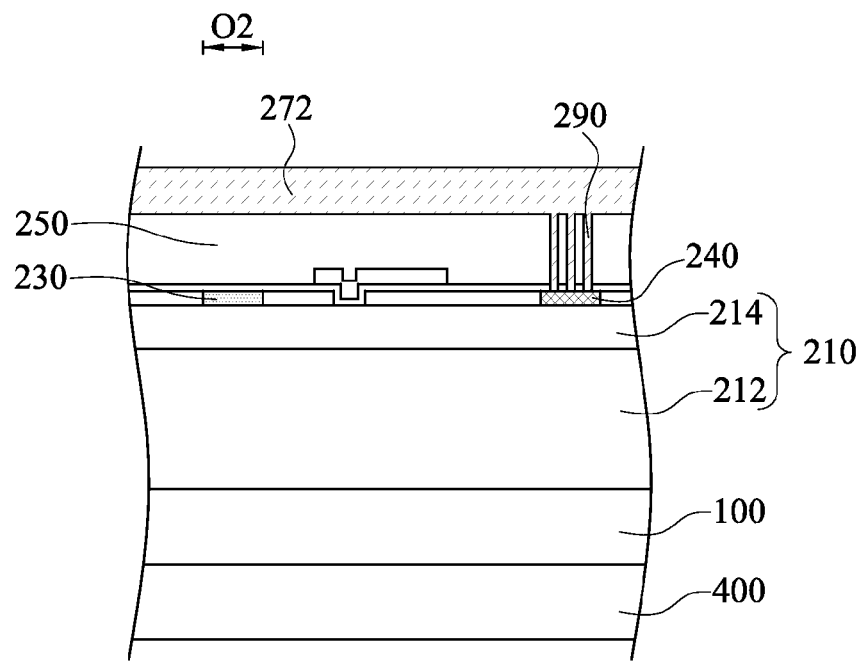
FIG. 3C is a cross-sectional view taken along 3C-3C of FIG. 2.

FIG. 3C is a cross-sectional view taken along line 3C-3C of FIG. 2. The drain plugs 290 may also be disposed between the drain pad body 272 and the drain electrode 240 to provide an adequate electrical connection between the drain pad body 272 and the drain electrode 240. In addition, because the drain pad body 272 is electrically isolated with the source electrode 230, no plug exists between the drain pad body 272 and the source electrode 230 (that is, the portion of the first insulating layer 250 above the overlapping region O2).

Reference is made again to FIG. 2, in summary, the first source pad 260 is electrically connected to the source electrodes 230 through the source pad branches 264 and a portion of the source pad body 262. With such a configuration, current can flow through the first source pad 260 and the source electrodes 230 to improve the resistance value of the source electrodes 230. Similarly, the first drain pad 270 is electrically connected to the drain electrodes 240 through the drain pad branches 274 and a portion of the drain pad body 272. With such a configuration, current can flow through the first drain pad 270 and the drain electrodes 240 to improve the resistance value of the drain electrodes 240.

Reference is made again to FIGS. 2 and 3A. In the present embodiment, the source electrode 230, the drain electrode 240, and the gate electrode 220 together define an active area 202. The active area 202 includes the source region SA, the drain region DA, and the region between the source region SA and the drain region DA in which current passes through the active layer 210. The transistor 200 further includes an insulation area 320 surrounding the active area 202, and at least a portion of the insulation area 320 is located in the active layer 210 to prevent leakage currents from being generated and thereby increases the breakdown voltage. In FIG. 2, the first source pad 260 and the first drain pad 270 are completely within the active area 202. In other words, the transistor 200 can be cut along the insulation area 320 according to the present embodiment. Hence, the vast majority of the active area 202 is put to good use and it is not necessary to add extra regions to the non-active area for accommodating source pads and drain pads. As a result, the size of the transistor 200 is effectively reduced, or a transistor is fabricated that is able to sustain a higher breakdown voltage or a larger on current with the same device size. In other embodiments, however, a portion of the first source pad 260 and/or a portion of the first drain pad 270 can be within the active area 202. Basically, any design in which the source pad region SPA and the drain region DA form the overlapping region O1 and the area of the overlapping region O1 is smaller than or equal to 40% of the area of the drain region DA, and/or in which the drain pad region DPA and the source region SA form the overlapping region O2 and the area of the overlapping region O2 is smaller than or equal to 40% of the area of the source region SA is within the scope of the invention.

Reference is made again to FIG. 3A. In one or more embodiments, the active layer 210 includes a plurality of different nitride-based semiconductor layers to allow two-dimensional electron gas (2DEG) to be generated at the heterojunction so as to create a conducting path. For example, a stack structure made up of a gallium nitride (GaN) layer 212 and an aluminum gallium nitride (AlGaN) layer 214 may be utilized, and the aluminum gallium nitride layer 214 is disposed on the gallium nitride layer 212. With this structure, two-dimensional electron gas can exist at the interface of the gallium nitride layer 212 and the aluminum gallium nitride layer 214. Thus, when the transistor 200 is in the on state, the on current between the source electrode 230 and the drain electrode 240 is able to flow along the interface of the gallium nitride layer 212 and the aluminum gallium nitride layer 214. In one embodiment, the transistor 200 may further include a buffer layer (not shown) disposed between the active layer 210 and the substrate 100.

Reference is made again to FIG. 2. In the present embodiment, the number of the source electrodes 230 and the number of the drain electrodes 240 are both plural. The source electrodes 230 are alternately arranged with the drain electrodes 240 to increase the amount of the on current flowing through the transistor 200. In order to provide an adequate electrical connection to the source electrodes 230 and the drain electrodes 240, the number of the source pad branches 264 may be plural, and the number of the drain pad branches 274 may also be plural. The source pad branches 264 and the drain pad branches 274 are alternately arranged between the source pad body 262 and the drain pad body 272. All the source pad branches 264 are over the source electrodes 230, and all the drain pad branches 274 are over the drain electrodes 240. Hence, each the first source pad 260 and the first drain pad 270 is a finger-shaped element.

Reference is made to FIG. 3A. In the present embodiment, the transistor 200 may further include a passivation layer 330 covering the active layer 210. The passivation layer 330 has at least one source opening 332 and at least one drain opening 334 therein. At least a portion of the source electrode 230 and at least a portion of the drain electrode 240 are respectively disposed in the source opening 332 and the drain opening 334. For example, in FIG. 3A, the source electrode 230 and the drain electrode 240 are respectively disposed in the source opening 332 and the drain opening 334 to electrically contact the active layer 210.

In one or more embodiments, the transistor 200 can further include a gate dielectric layer 340 disposed at least between the gate electrode 220 and the active layer 210. The first insulating layer 250 covers the gate dielectric layer 340. The gate dielectric layer 340 can optionally cover the passivation layer 330, and the gate dielectric layer 340 has at least one first inter-source via hole 342 and at least one first inter-drain via hole 344. A portion of the source plug 280 is filled in the first inter-source via hole 342 to be electrically connected to the first source pad 260 and the source electrode 230. A portion of the drain plug 290 is filled in the first inter-drain via hole 344 to be electrically connected to the first drain pad 270 and the drain electrode 240.

In one or more embodiments, the passivation layer 330 has at least one gate opening 336 therein. The gate dielectric layer 340 and the gate electrode 220 cover the gate opening 336. The presence of the gate opening 336 can function to adjust the electrical properties of the gate electrode 220. For example, the transistor 200 in this embodiment can be a depletion mode transistor. However, in other embodiments, the passivation layer 330 may not have the gate opening 336, and the invention is not limited in this respect.

In the following, the electrical properties of the present embodiment transistor 200 are illustrated with reference to FIGS. 2 and 3A. For the sake of convenience, it is worth noting that a single gate electrode 220, a single source electrode 230, and a single drain electrode 240 are utilized for the calculation of the electrical properties in the present example. According to the present example, each of the source electrode 230 and the drain electrode 240 has a width W=4 μm and a length L2=1000 μm, and so the area of each of the source region SA and the area of the drain region DA is L2*W=4000 μm². In addition, the overlapping region O1 has a length L1=100 μm and the overlapping region O2 has a length L3=100 μm. Hence, the area of the overlapping region O1 is L1*W=400 μm² and the area of the overlapping region O2 is L3*W=400 μm². That is, the area of the overlapping region O1 is equal to 10% of the area of the drain region DA, and the area of the overlapping region O2 is equal to 10% of the area of the source region SA. When compared with the traditional vertical circuit layout structure, the amount of parasitic capacitance generated in the present example structure is 20% of that generated in the traditional vertical circuit layout structure.

Moreover, the source electrode 230 and the drain electrode 240 both have a thickness T1=0.2 μm. The first source pad 260 and the first drain pad 270 both have a thickness T2=4 μm. A distance between the source pad body 262 and the drain pad branch 274 is D1=10 μm. A distance between the drain pad body 272 and the source pad branch 264 is D2=10 μm. The source pad branch 264 has a width Ws=15 μm and the drain pad branch 274 has a width Wd=4.2 μm. In addition, the resistivities of the source electrode 230, the drain electrode 240, the first source pad 260, and the first drain pad 270 are all ρ. Since the resistance values of the source electrode 230 and the drain electrode 240 per unit length are much greater than the resistance values of the first source pad 260 and the first drain pad 270 per unit length, effects contributed by the source electrode 230 and the drain electrode 240 can be negligible when calculating the total effects in areas where the first source pad 260 and the first drain pad 270 are located to thereby simplify the calculation. Based on the above, the total resistance of the source electrode 230 and the first source pad 260 is approximately calculated as follows:

$$Rs=\rho*(L3+D2)/(T1*W)+\rho*(L2-L3-D2-L1)/(T2*Ws)$$
$$\sim 151*\rho$$

(here the resistance of the source pad body 260 is negligible). The total resistance of the drain electrode 240 and the first drain pad 270 is approximately calculated as follows:

$$Rd=\rho*(L1+D1)/(T1*W)+\rho*(L2-L1-D1-L3)/(T2*Wd)\sim 185*\rho$$

(here the resistance of the drain pad body 272 is negligible). If the materials of the source electrode 230, the drain electrode 240, the first source pad 260, and the first drain pad 270 is not changed, the total resistance Rs or Rd of the source pads or the drain pads in the traditional vertical circuit layout structure is approximately 625ρ. It is apparent that both the resistance and parasitic capacitance generated in the transistor 200 of the present example are smaller than those generated in the prior art vertical circuit layout structure. In addition, an area utilization ratio of the transistor 200 of the present embodiment is higher than that in the prior art horizontal circuit layout structure (areas required by the source pads and the drain pads are all outside the active area).

Figure 4:
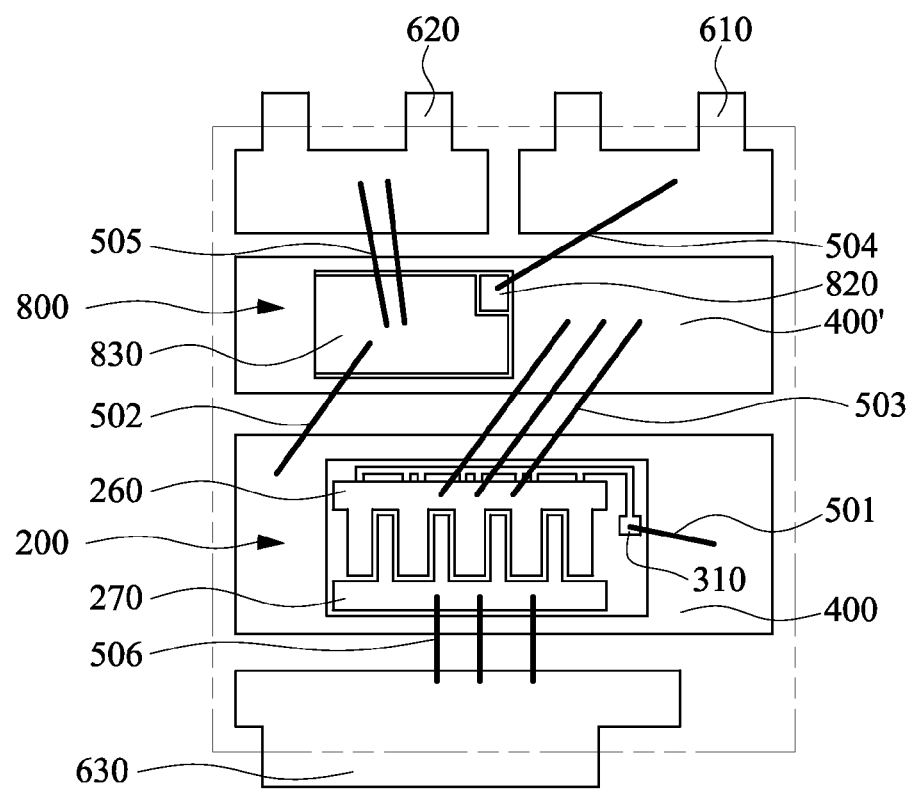
FIG. 4 is a top view of a semiconductor device package according to another embodiment of the present invention.
Figure 5:
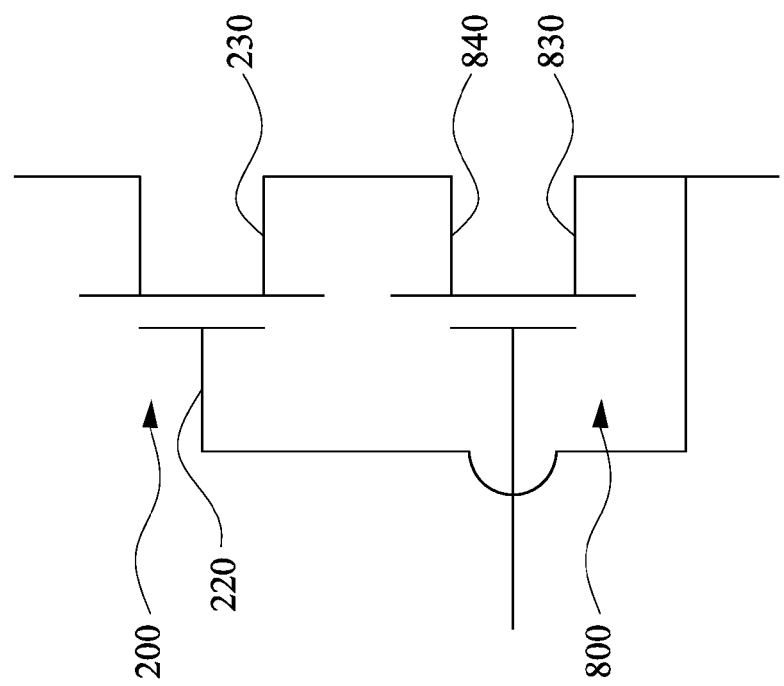
FIG. 5 is an electrical diagram of the semiconductor device package of FIG. 4.

FIG. 4 is a top view of a semiconductor device package according to another embodiment of the present invention, and FIG. 5 is an electrical diagram of the semiconductor device package of FIG. 4. In this embodiment, the transistor 200 is a depletion mode transistor, and the semiconductor device package can further include an enhancement mode transistor 800 electrically connected to the transistor 200. In the electrically diagram as shown in FIG. 5, the source electrode 230 of the transistor 200 is electrically connected to a drain electrode 840 of the enhancement mode transistor 800. From a structural point of view, as shown in FIG. 4, the source electrode 230 (see FIG. 2) of the transistor 200 is eclectically connected to the first source pad 260, and the first source pad 260 is electrically connected to another lead frame 400' through a conductive element 503. The drain electrode 840 (see FIG. 5) of the enhancement mode transistor 800 is disposed opposite to a source electrode 830. That is, the drain electrode 840 directly touches the lead frame 400' and makes an electrical connection thereto. Hence, the electrical connection between the source electrode 230 of the transistor 200 and the drain electrode 840 of the enhancement mode transistor 800 is accomplished. Furthermore, the gate pin 610 is electrically connected to a gate electrode 820 of the enhancement mode transistor 800 through a conductive element 504. The source pin 620 is electrically connected to the source electrode 830 of the enhancement mode transistor 800 through a conductive element 505. The drain pin 630 is electrically connected to the first drain pad 270 of the transistor 200 through a conductive element 506. Reference is made again to FIG. 5, in one embodiment of the present invention, the gate electrode 220 of the transistor 200 can be electrically connected to the source electrode 830 of the enhancement mode transistor 800 to simplify the circuit control. As shown in FIG. 4, the gate electrode 220 (see FIG. 2) of the transistor 200 is connected to the gate pad 310, and the gate pad 310 is electrically connected to the lead frame 400 through a conductive element 501. A conductive element 502 is electrically connected to the lead frame 400 and the source electrode 830 of the enhancement mode transistor 800. Hence, the electrical connection between the gate electrode 220 of the transistor 200 and the source electrode 830 of the enhancement mode transistor 800 is accomplished. In another embodiment of the present invention, the gate electrode 220 of the transistor 200 is not electrically connected to the source electrode 830 of the enhancement mode transistor 800. Instead, depending on product requirements, the semiconductor device package can further include an independent pin to enable independent circuit control operation with respect to the gate electrode 220 of the transistor 200.

In one embodiment of the present invention, the transistor 200 is a depletion mode transistor with high operation voltage and low on-resistance, such as a gallium nitride transistor, and the enhancement mode transistor 800 have high switch speed, such that the transistor 200 and the enhancement mode transistor 800 can be combined as an enhancement mode transistor with high operation voltage, low on-resistance, and high switch speed.

Figure 6:
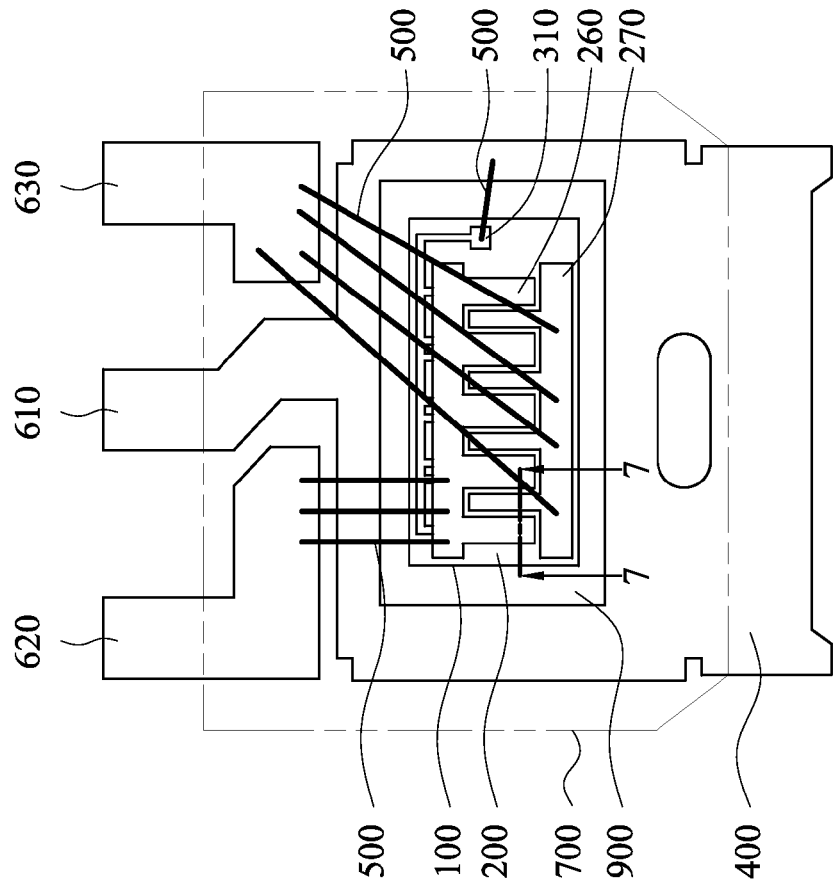
FIG. 6 is a top view of a semiconductor device package according to yet another embodiment of the present invention.
Figure 7:
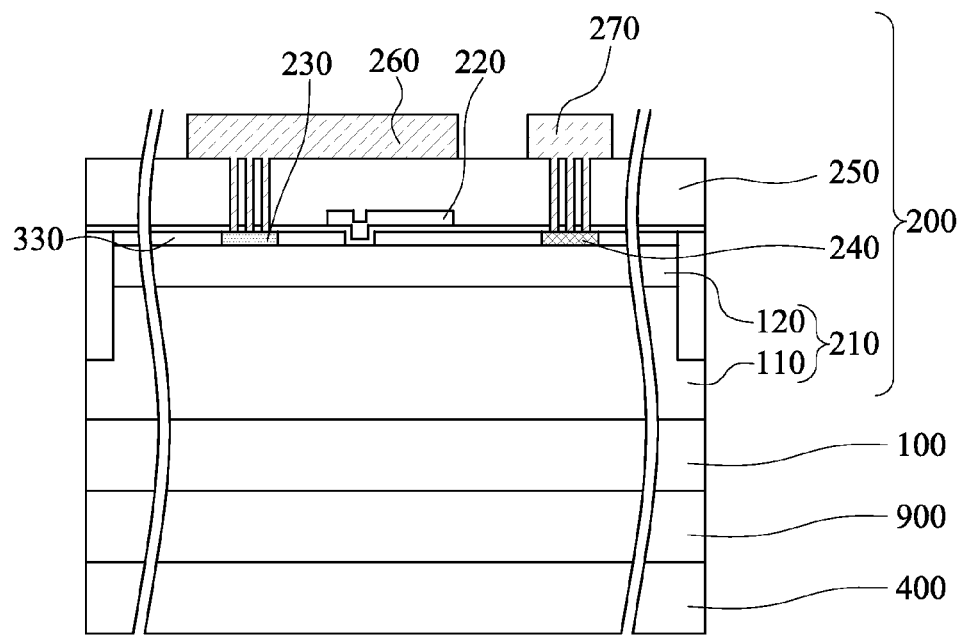
FIG. 7 is a cross-sectional view taken along line 7-7 of FIG. 6.

FIG. 6 is a top view of a semiconductor device package according to yet another embodiment of the present invention, and FIG. 7 is a cross-sectional view taken along line 7-7 of FIG. 6. The difference between the present embodiment and the embodiment of FIG. 1 pertains to the presence of an inter-insulating layer 900. In this embodiment, the semiconductor device package can further include an inter-insulating layer 900 disposed between the lead frame 400 and the substrate 100. The inter-insulating layer 900 can further reduce the overall parasitic capacitance of the semiconductor device package. More specifically, since the lead frame 400 of the semiconductor device package of FIG. 1 is electrically connected to the gate electrode 220, a gate-drain parasitic capacitance is generated between the lead frame 400 and the transistor 200. In this embodiment, however, a gate-drain parasitic capacitance is generated between the substrate 100 and the active layer 210 of the transistor 200. Due to the presence of the inter-insulating layer 900, another gate-drain parasitic capacitance is generated between the substrate 100 and the lead frame 400. Since the gate-drain parasitic capacitances between the substrate 100 and the lead frame 400 and between the substrate 100 and the active layer 210 are formed in a series manner, the overall parasitic capacitance of the semiconductor device package can be reduced if the parasitic capacitance between the substrate 100 and the lead frame 400 is smaller than the parasitic capacitance between the substrate 100 and the active layer 210. Other relevant structural details of the present embodiment are all the same as the embodiment of FIG. 1, and, therefore, a description in this regard will not be repeated hereinafter.

Figure 8:
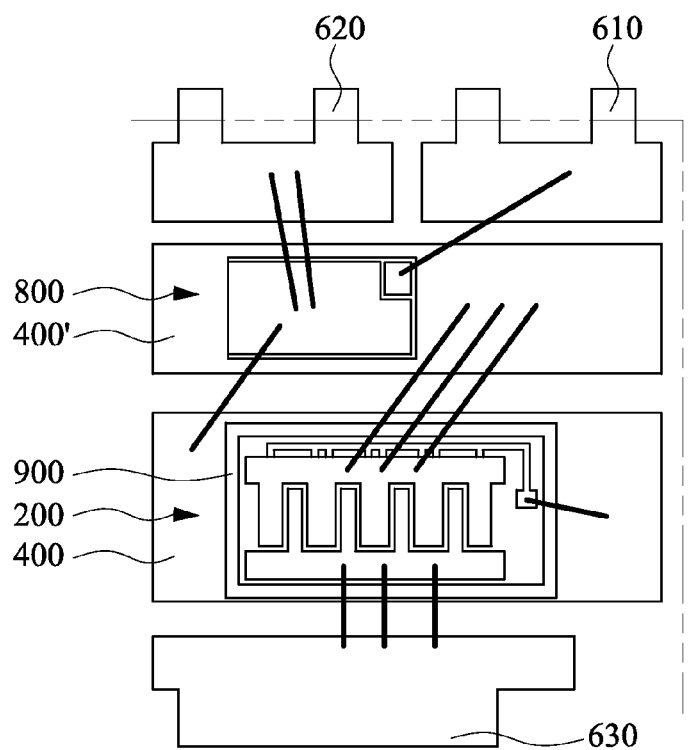
FIG. 8 is a top view of a semiconductor device package according to another embodiment of the present invention.

Reference is made to FIG. 8 which is a top view of a semiconductor device package according to another embodiment of the present invention. The circuit diagram of the semiconductor device package in FIG. 8 is shown in FIG. 5. The difference between the present embodiment and the embodiment of FIG. 4 pertains to the presence of an inter-insulating layer 900. This configuration can further reduce the parasitic capacitance of the semiconductor device package, especially of the transistor 200. Hence, the breakdown voltage of the semiconductor device package is increased. Other relevant structural details of the present embodiment are all the same as the embodiment of FIG. 4, and, therefore, a description in this regard will not be repeated hereinafter.

Figure 9:
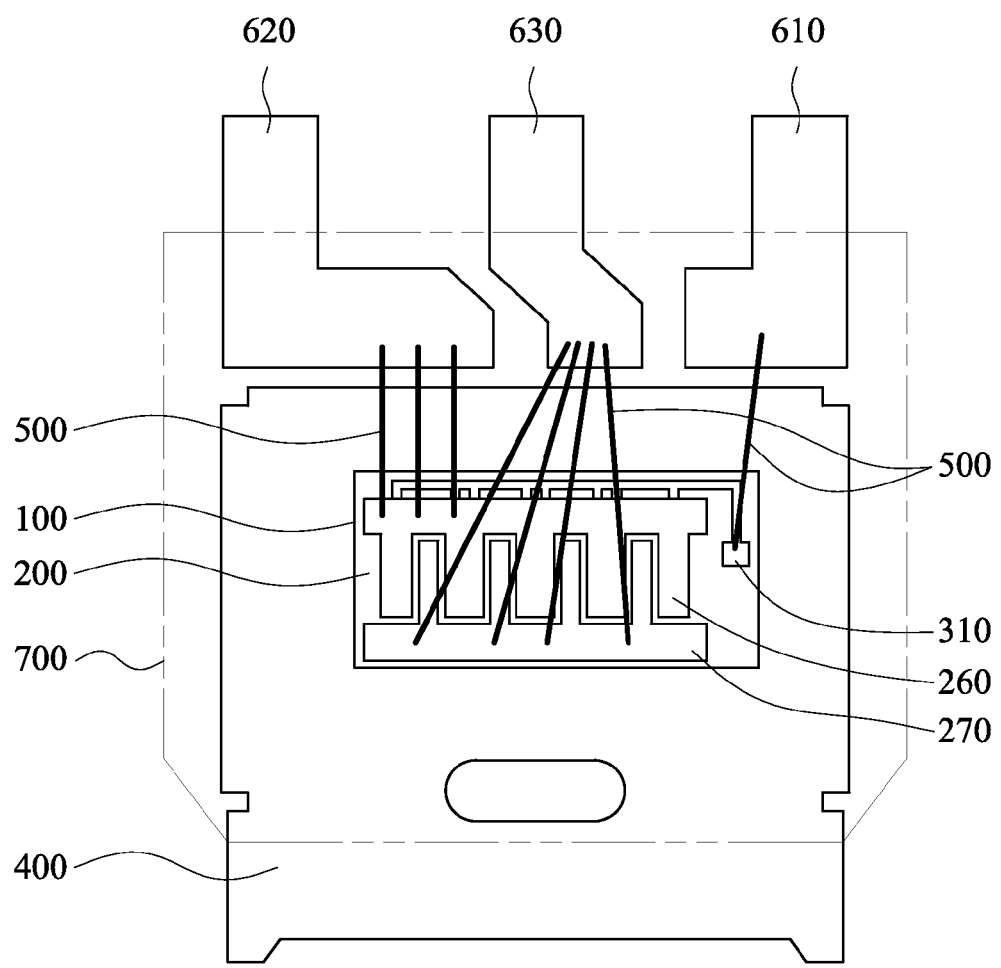
FIG. 9 is a top view of a semiconductor device package according to yet another embodiment of the present invention.

FIG. 9 is a top view of a semiconductor device package according to yet another embodiment of the present invention. The structure of the transistor 200 in FIG. 9 is the same as that of FIG. 2. The difference between the present embodiment and the embodiment of FIG. 1 pertains to the electrical connection between the lead frame 400 and the gate electrode 220. In this embodiment, the lead frame 400 is electrically isolated with the gate electrode 220, the source electrode 230, and the drain electrode 240. That is, the lead frame 400 is floating, such that there is no parasitic capacitance generated between the transistor 200 and the lead frame 400. From a structural point of view, the gate pin 610 is electrically connected to the gate electrode 220. For example, in FIG. 9, the gate pin 610 can be electrically connected to the gate electrode 220 through a conductive element 500 and the gate pad 310. The source pin 620 is electrically connected to the source electrode 230. For example, in FIG. 9, the source pin 620 can be electrically connected to the source electrode 230 through a conductive element 500 and the first source pad 260. The drain pin 630 is electrically connected to the drain electrode 240. For example, in FIG. 9, the drain pin 630 can be electrically connected to the drain electrode 240 through a conductive element 500 and the first drain pad 270. All of the gate pin 610, the source pin 620, and the drain pin 630 are electrically isolated with the lead frame 400. Furthermore, in other embodiment, the semiconductor device package can further include the inter-isolating layer 900 (see FIG. 8) disposed between the substrate 100 and the lead frame 400 to further reduce the overall capacitance of the semiconductor device package. Other relevant structural details of the present embodiment are all the same as the embodiment of FIG. 1, and, therefore, a description in this regard will not be repeated hereinafter.

Figure 10:
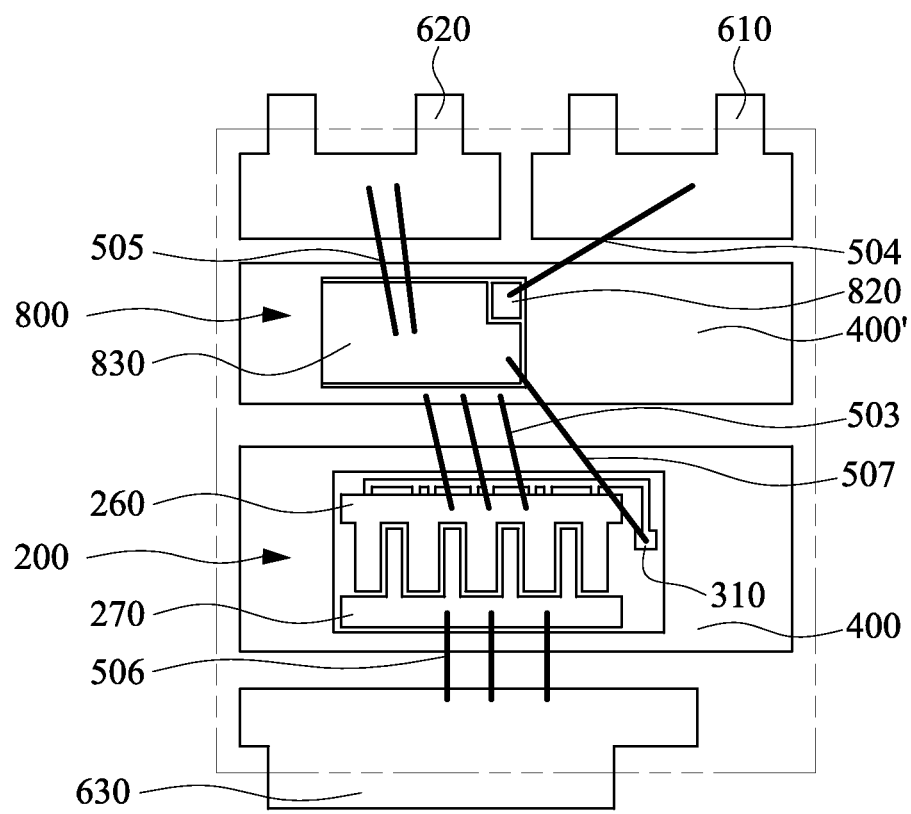
FIG. 10 is a top view of a semiconductor device package according to yet another embodiment of the present invention.

FIG. 10 is a top view of a semiconductor device package according to yet another embodiment of the present invention. The circuit diagram of the semiconductor device package of FIG. 10 is shown in FIG. 5. The difference between the present embodiment and the embodiment of FIG. 4 pertains to the electrical connection between the lead frame 400 and the gate pad 310. In this embodiment, both of the gate pad 310 of the transistor 200 and the source electrode 830 of the enhancement mode transistor 800 are electrically isolated with the lead frame 400. The gate pad 310 is directly electrically connected to the source electrode 830 through a conductive element 507. That is, the lead frame 400 is floating, such that there is no parasitic capacitance generated between the transistor 200 and the lead frame 400. In other embodiments, depending on product requirements, the semiconductor device package can further include an independent pin to enable independent circuit control operation with respect to the gate electrode 220 of the transistor 200 according to product requirements. Furthermore, in yet another embodiments, the semiconductor device package can further include the inter-insulating layer 900 (see FIG. 8) disposed between the substrate 100 and the lead frame 400 to further reduce the overall capacitance of the semiconductor device package.

Other relevant structural details of the present embodiment are all the same as the embodiment of FIG. 4, and, therefore, a description in this regard will not be repeated hereinafter.

FIG. 11 is a top view of a semiconductor device package according to yet another embodiment of the present invention. The structure of the transistor 200 of FIG. 11 is shown in FIG. 7. The difference between the present embodiment and the embodiment of FIG. 6 pertains to the electrical connection among the lead frame 400, the gate electrode 220, and the source electrode 230. In this embodiment, the lead frame 400 is electrically connected to the source electrode 230. Alternately, the lead frame 400 can be electrically connected to the drain electrode 240. From a structural point of view, the gate pin 610 is electrically connected to the gate electrode 220. For example, in FIG. 11, the gate pin 610 can be electrically connected to the gate electrode 220 through a conductive element 500 and the gate pad 310. The source pin 620 is electrically connected to the source electrode 230. For example, the source pin 620 can be electrically connected to the lead frame 400, and the lead frame 400 is electrically connected to the source electrode 230 through a conductive element 500 and the first source pad 260. The drain pin 630 is electrically connected to the drain electrode 240. For example, the drain pin 630 can be electrically connected to the drain electrode 240 through a conductive element 500 and the first drain pad 270.

In this embodiment, a source-drain parasitic capacitance is generated between the substrate 100 and the active layer 210 of the transistor 200. Due to the presence of the inter-insulating layer 900, another source-drain parasitic capacitance is generated between the substrate 100 and the lead frame 400. These two parasitic capacitances are formed in a series configuration, such that the overall parasitic capacitance of the semiconductor device package can be reduced if the parasitic capacitance generated between the substrate 110 and the lead frame 400 is smaller than the parasitic capacitance generated between the substrate 110 and the active layer 210. Other relevant structural details of the present embodiment are all the same as the embodiment of FIG. 6, and, therefore, a description in this regard will not be repeated hereinafter.

FIG. 12 is a top view of a semiconductor device package according to yet another embodiment of the present invention. The circuit diagram of the semiconductor device package in FIG. 12 is shown in FIG. 5, and the cross-sectional view of the transistor 200 in FIG. 12 is shown in FIG. 7. From a structural point of view, as shown in FIG. 12, the gate electrode 220 (see FIG. 7) of the transistor 200 is connected to the gate pad 310, and the gate pad 310 is electrically connected to the source electrode 830 of the enhancement mode transistor 800 through a conductive element 511 to generate the electrical connection between the gate electrode 220 of the transistor 200 and the source electrode 830 of the enhancement mode transistor 800. In other embodiments, however, the semiconductor device package can further include an individually pin to be an individually circuit control operation with respect to the gate electrode 220 of the transistor 200 according to product requirements. Moreover, the source electrode 230 (see FIG. 7) of the transistor 200 is electrically connected to the first source pad 260, and the first source pad 260 is electrically connected to the lead frame 400 through a conductive element 512. The drain electrode 840 (see FIG. 5) of the enhancement mode transistor 800 is disposed opposite to the source electrode 830. That is, the drain electrode 840 directly touches the lead frame 400 and make an electrical connection thereto to generate the electrical connection between the source electrode 230 of the transistor 200 and the drain electrode 840 of the enhancement mode transistor 800.

Furthermore, the gate pin 610 is electrically connected to the gate electrode 820 of the enhancement mode transistor 800 through a conductive element 513. The source pin 620 is electrically connected to the source electrode 830 of the enhancement mode transistor 800 through a conductive element 514. The drain pin 630 is electrically connected to the first drain pad 270 of the transistor 200 through a conductive element 515. Similarly, an inter-isolating layer 900 (see FIG. 8) can be disposed between the substrate 100 and the lead frame 400 to further reduce the overall capacitance of the semiconductor device package. Other relevant structural details of the present embodiment are all the same as the embodiment of FIG. 8, and, therefore, a description in this regard will not be repeated hereinafter.

Figure 13:
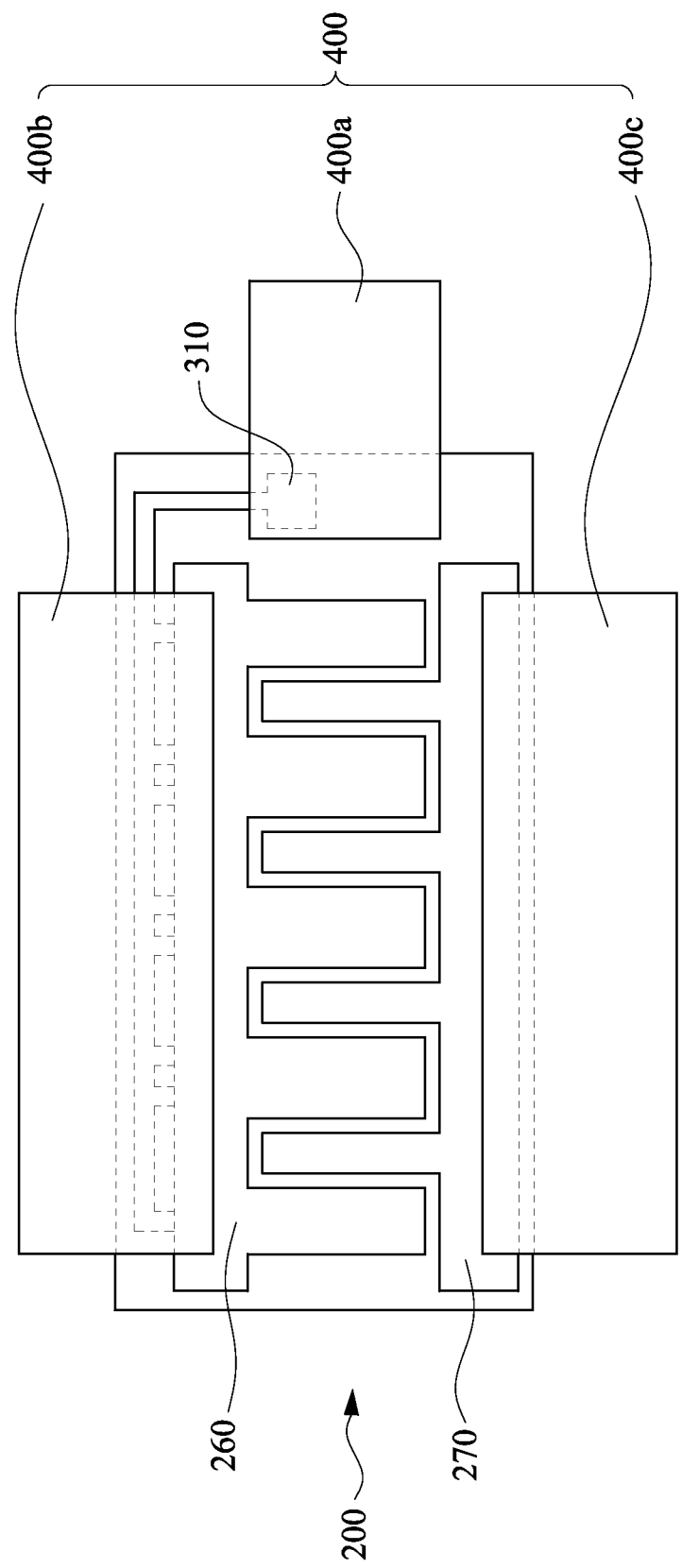
FIG. 13 is a bottom view of a semiconductor device package according to yet another embodiment of the present invention.

FIG. 13 is a bottom view of a semiconductor device package according to yet another embodiment of the present invention. The structure of the transistor 200 in FIG. 13 is shown in FIG. 2. The difference between the present embodiment and the embodiment of FIG. 1 pertains to the configuration of the lead frame 400. In this embodiment, the lead frame 400 includes a first portion 400a, a second portion 400b, and a third portion 400c, and the transistor 200 is electrically connected to the lead frame 400 using a flip-chip configuration. The first portion 400a is electrically connected to the gate electrode 220 through the gate pad 310. The second portion 400b is electrically connected to the source electrode 230 through the first source pad 260. The third portion 400c is electrically connected to the drain electrode 240 through the first drain pad 270. The first portion 400a, the second portion 400b, and the third portion 400c can be pins to be electrically connected to other elements. Moreover, the substrate 100 can be electrically connected to the gate electrode 220 using the aforementioned method to further reduce the capacitance of the semiconductor device package. For example, the substrate 100 can be electrically connected to the gate electrode 220 through an internal connection or an external connecting device. In another embodiments of the present invention, an inter-insulating layer can be disposed on a side of the substrate 100 opposite to the transistor 200, and a conductive layer, which is electrically connected to the gate electrode 220, is disposed on the inter-insulating layer for further reducing the capacitance of the semiconductor device package.

Figure 14:
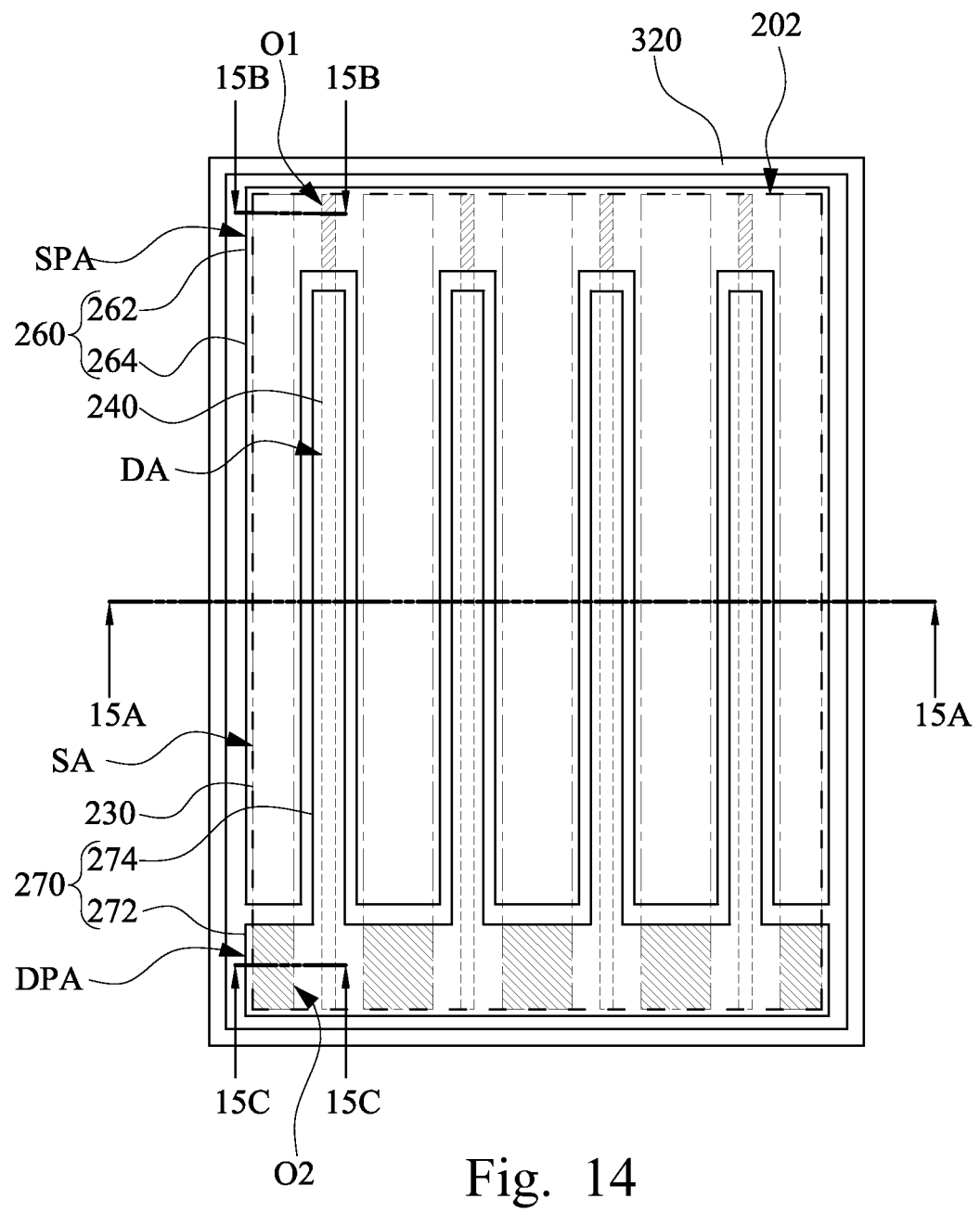
FIG. 14 is an enlarged diagram of area M in FIG. 1 according to another embodiment.
Figure 15A:
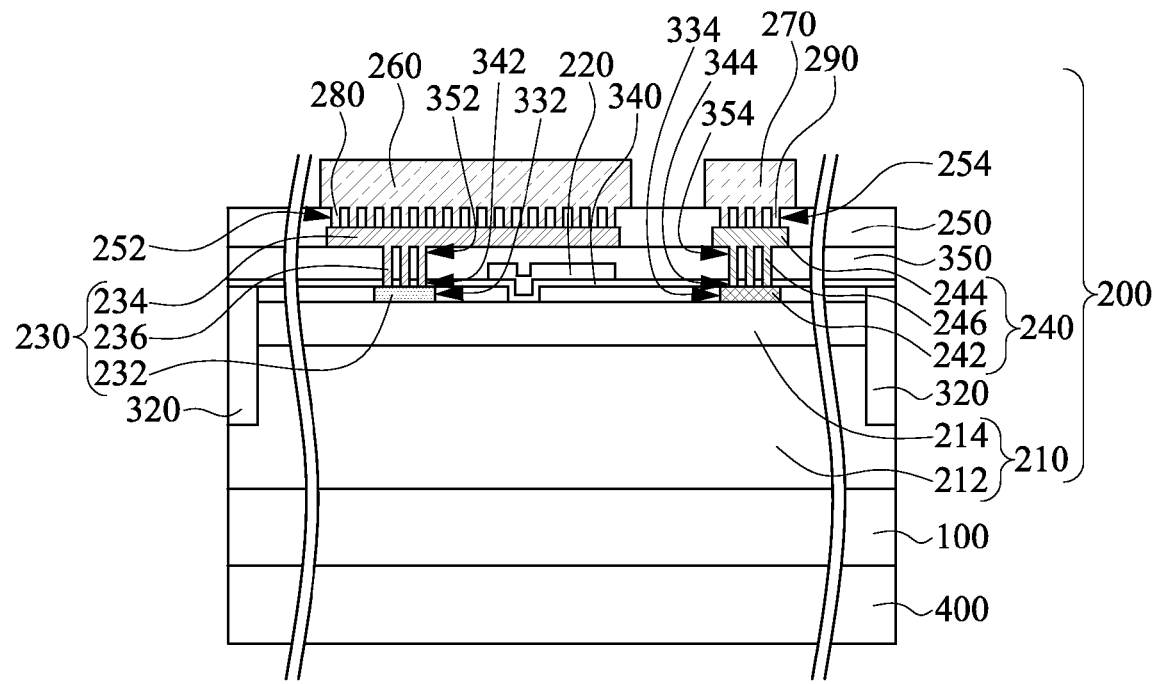
FIG. 15A is a cross-sectional view taken along line 15A-15A of FIG. 14.

While the paragraphs above provide details with respect to the package, the following paragraphs provide detailed explanations with respect to the transistor 200. FIG. 14 is an enlarged diagram of area M in FIG. 1 according to another embodiment, and FIG. 15A is a cross-sectional view taken along line 15A-15A of FIG. 14. The difference between the present embodiment and the embodiment of FIG. 2 pertains to the structures of the source electrode 230 and the drain electrode 240, and the presence of an interlayer dielectric 350. In this embodiment, the transistor 200 further includes the interlayer dielectric 350 covering the gate dielectric layer 340, and the interlayer dielectric 350 has at least one second inter-source via hole 352. Moreover, the source electrode 230 includes a lower sub-source electrode 232, an upper sub-source electrode 234, and at least one inter-source plug 236. The lower sub-source electrode 232 is disposed in the source opening 332. The upper sub-source electrode 234 is disposed on the interlayer dielectric 350. The inter-source plug 236 is filled in the first inter-source via hole 342 and the second inter-source via hole 352, and is electrically connected to the upper sub-source electrode 234 and the lower sub-source electrode 232.

In addition, the interlayer dielectric 350 has at least one second inter-drain via hole 354. The drain electrode 240 includes a lower sub-drain electrode 242, an upper sub-drain electrode 244, and at least one inter-drain plug 246. The lower sub-drain electrode 242 is disposed in the drain opening 334, and the upper sub-drain electrode 244 is disposed on the interlayer dielectric 350. The inter-drain plug 246 is filled in the first inter-drain via hole 344 and the second inter-drain via hole 354, and electrically connected to the upper sub-drain electrode 244 and the lower sub-drain electrode 242.

In the present embodiment, the lower sub-source electrode 232 of the source electrode 230 directly contacts the active layer 210 and may be an ohmic electrode having a large resistance value per unit length. Hence, the upper sub-source electrode 234 that has a resistance value per unit length smaller than the resistance value of the lower sub-source electrode 232 per unit length is added over the lower sub-source electrode 232. As a result, the overall resistance value of the source electrode 230 is reduced by electrically connecting the upper sub-source electrode 234 to the lower sub-source electrode 232.

Similarly, the lower sub-drain electrode 242 of the drain electrode 240 directly contacts the active layer 210 and may be an ohmic electrode having a large resistance value per unit length. Hence, the upper sub-drain electrode 244 that has a resistance value per unit length smaller than the resistance value of the lower sub-drain electrode 242 per unit length is added over the lower sub-drain electrode 242. As a result, the overall resistance value of the drain electrode 240 is reduced by electrically connecting the upper sub-drain electrode 244 to the lower sub-drain electrode 242.

Figure 15B:
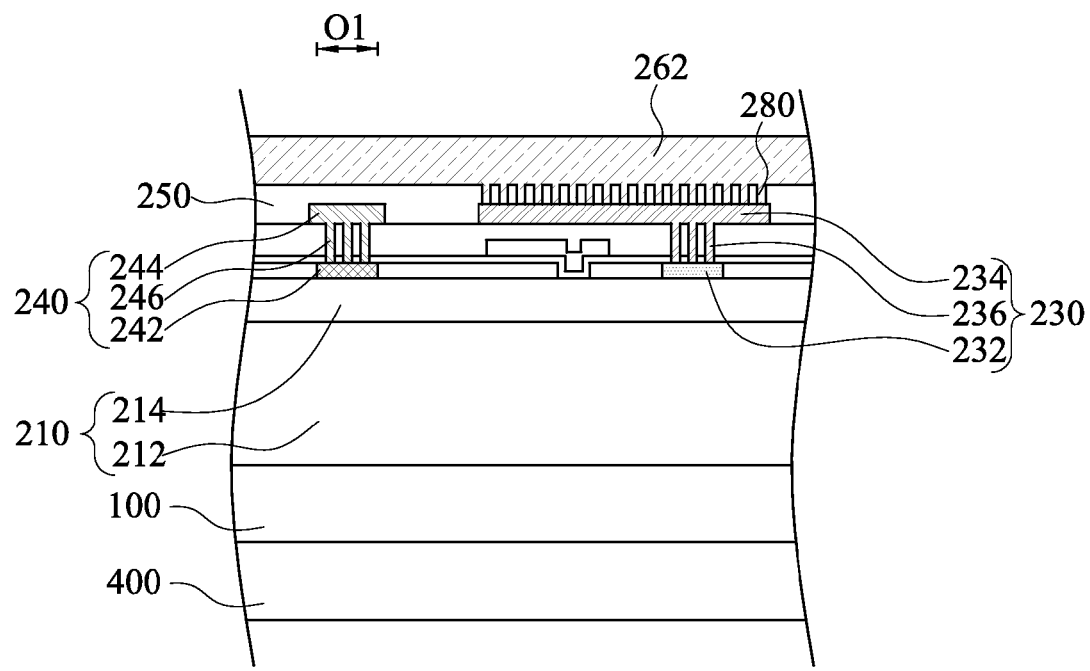
FIG. 15B is a cross-sectional view taken along line 15B-15B of FIG. 14.

FIG. 15B is a cross-sectional view taken along line 15B-15B of FIG. 14. A detailed description of electrical connections between the various electrode layers below the source pad body 262 will now be provided. First, the source pad body 262 is electrically connected to the upper sub-source electrode 234 through the source plugs 280. Below the source pad body 262, the upper sub-source electrode 234 and the lower sub-source electrode 232 are electrically connected through the inter-source plugs 236. Hence, current can flow through the source electrode 230 and the source pad body 262. In addition, below the source pad body 262, the upper sub-drain electrode 244 and the lower sub-drain electrode 242 are electrically connected through the inter-drain plugs 246. Hence, current can flow through the upper sub-drain electrode 244 and the lower sub-drain electrode 242.

Figure 15C:
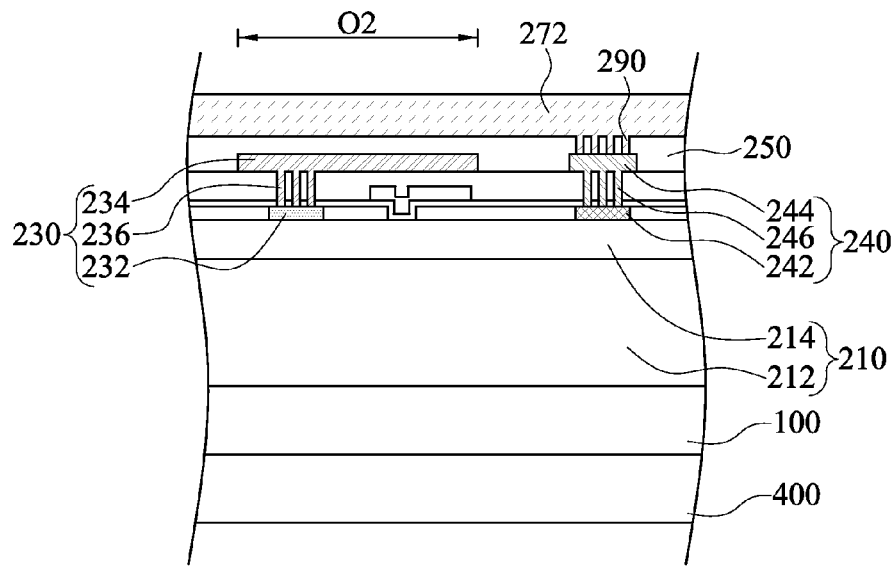
FIG. 15C is a cross-sectional view taken along line 15C-15C of FIG. 14.

FIG. 15C is a cross-sectional view taken along line 15C-15C of FIG. 14. A detailed description of electrical connections between the various electrode layers below the drain pad body 272 will now be provided. First, the drain pad body 272 is electrically connected to the upper sub-drain electrode 244 through the drain plugs 290. Below the drain pad body 272, the upper sub-drain electrode 244 and the lower sub-drain electrode 242 are electrically connected through the inter-drain plugs 246. Hence, current can flow through the drain electrode 240 and the drain pad body 272. In addition, below the drain pad body 272, the upper sub-source electrode 234 and the lower sub-source electrode 232 are electrically connected through the inter-source plugs 236. Hence, current can flow through the upper sub-source electrode 234 and the lower sub-source electrode 232. Other relevant structural details of the present embodiment are all the same as the embodiment of FIG. 2, and, therefore, a description in this regard will not be repeated hereinafter.

Figure 16A:
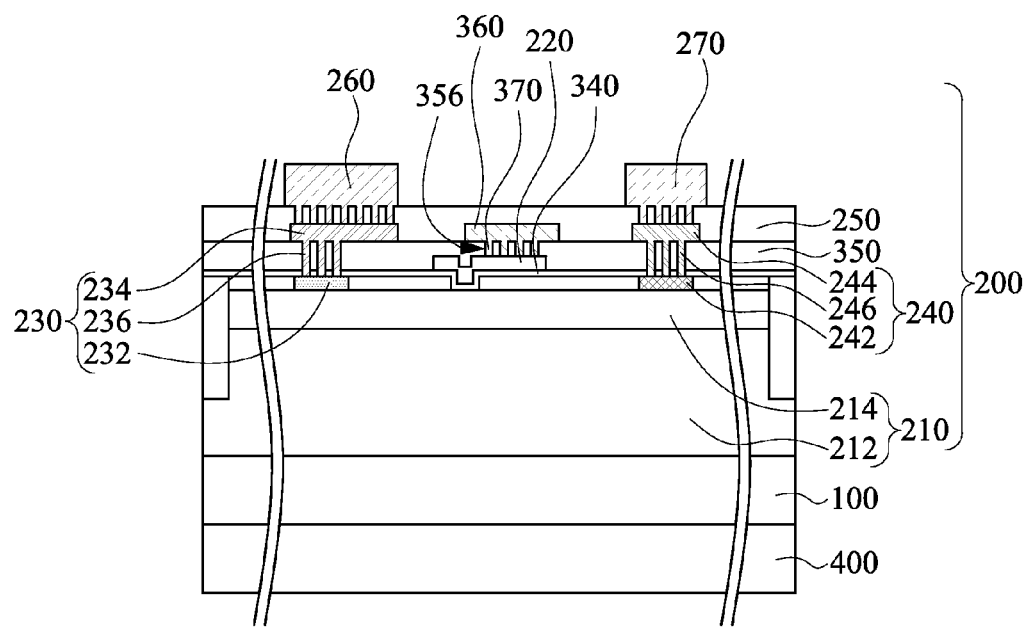
FIG. 16A is a cross-sectional view of a transistor of FIG. 1 according to another embodiment.

Reference is made to FIG. 16A which is a cross-sectional view of the transistor 200 of FIG. 1 according to another embodiment. The cross-sectional position of FIG. 16A is the same as that of FIG. 15A. The difference between the present embodiment and the embodiment of FIG. 15A pertains to the presence of an inter-gate layer 360 and a first inter-gate plug 370. In this embodiment, the interlayer dielectric 350 further has at least one first inter-gate via hole 356, and the transistor 200 can further include the inter-gate layer 360 and the first inter-gate plug 370. The inter-gate layer 360 is disposed between the interlayer dielectric 350 and the first insulating layer 250. The first inter-gate plug 370 is filled in the first inter-gate via hole 356 and is electrically connected to the inter-gate layer 360 and the gate electrode 220. Reference is made to FIG. 15A. In general, the upper sub-source electrode 234 may be connected to a field plate which extending above the gate electrode 220 to disperse the electric field of the active layer 210. Such a configuration, however, not only generates a gate-source parasitic capacitance between the gate electrode 220 and the upper sub-source electrode 234, which increases the capacitance (Cgs) between the gate electrode 220 and the source electrode 230 of the transistor 200, but generates a source-drain parasitic capacitance between the upper sub-source electrode 234 and the active layer 210. Reference is made to FIG. 15C. Furthermore, a parasitic capacitance is generated between the upper sub-source electrode 234 and the drain pad body 272, which increases the capacitance (Cds) between the source electrode 230 and the drain electrode 240 of the transistor 200. Reference is made to FIG. 16A. In this embodiment, in contrast, the inter-gate layer 360 is above the gate electrode 220, such that the inter-gate layer 360 can replace the upper sub-source electrode 234 to be the field plate. Hence, since the upper sub-source electrode 234 is unnecessary to be above of the gate electrode 220, the capacitances (Cgs and Cds) can be reduced. In addition, there is no further manufacturing process if the inter-gate layer 360 and the upper sub-source electrode 234 are formed together.

Furthermore, in one or more embodiments, the positions among the first source pad 260, the first drain pad 270, and the gate electrode 220 can be suitably arranged to make the orthogonal projections of the first source pad 260, the first drain pad 270, and the gate electrode 220 on the active layer 210 are separated from each other. Alternately, an area of an overlapping region between the orthogonal projection of the gate electrode 220 and one of the orthogonal projections of the first source pad 260 and the first drain pad 270 on the active layer 210 is smaller than 10% of an area of the orthogonal projection of the gate electrode 220 on the active layer 210. That is, both of the first source pad 260 and the first drain pad 270 do not extend above the gate electrode 220, or extend above a portion of the gate electrode 220. This configuration can further reduce the capacitances (Cgs and Cds). Other relevant structural details of the present embodiment are all the same as the embodiment of FIG. 15A, and, therefore, a description in this regard will not be repeated hereinafter.

Figure 16B:
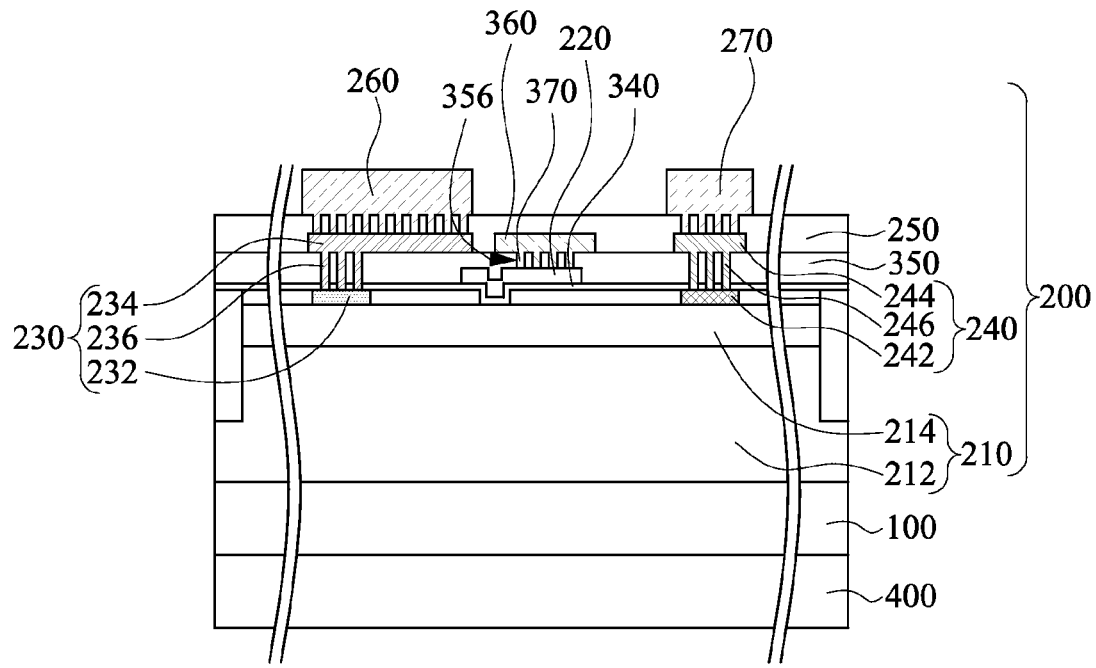
FIG. 16B is a cross-sectional view of a transistor of FIG. 1 according to yet another embodiment.

Reference is made to FIG. 16B which is a cross-sectional view of the transistor 200 of FIG. 1 according to yet another embodiment. The cross-sectional position of FIG. 16B is the same as that of FIG. 16A. The difference between the present embodiment and the embodiment of FIG. 16A pertains to the relative positions among the first source pad 260, the upper sub-source electrode 234, and the gate electrode 220. In this embodiment, the orthogonal projection of the gate electrode 220 on the active layer 210 overlaps the orthogonal projections of the first source pad 260 and the upper sub-source electrode 234 on the active layer 210, and an area of an overlapping region can be smaller than 10% of the area of an orthogonal projection of the gate electrode 220 on the active layer 210. Moreover, the orthogonal projections of the first source pad 260 and the inter-gate layer 360 on the active layer 210 can be separated from each other to reduce the capacitance between the source electrode 230 and the gate electrode 220. Such a configuration provides large layout areas of the first source pad 260 and the upper sub-source electrode 234 to reduce the overall resistance of the source electrode 230. Furthermore, in other embodiments, the orthogonal projection of the gate electrode 220 on the active layer 210 can overlap the orthogonal projections of the first drain pad 270 and the upper sub-drain electrode 244 on the active layer 210, and an area of an overlapping region can be smaller than 10% of the area of an orthogonal projection of the gate electrode 220 on the active layer 210 to reduce the overall resistance of the drain electrode 240. Other relevant structural details of the present embodiment are all the same as the embodiment of FIG. 16A, and, therefore, a description in this regard will not be repeated hereinafter.

Figure 16C:
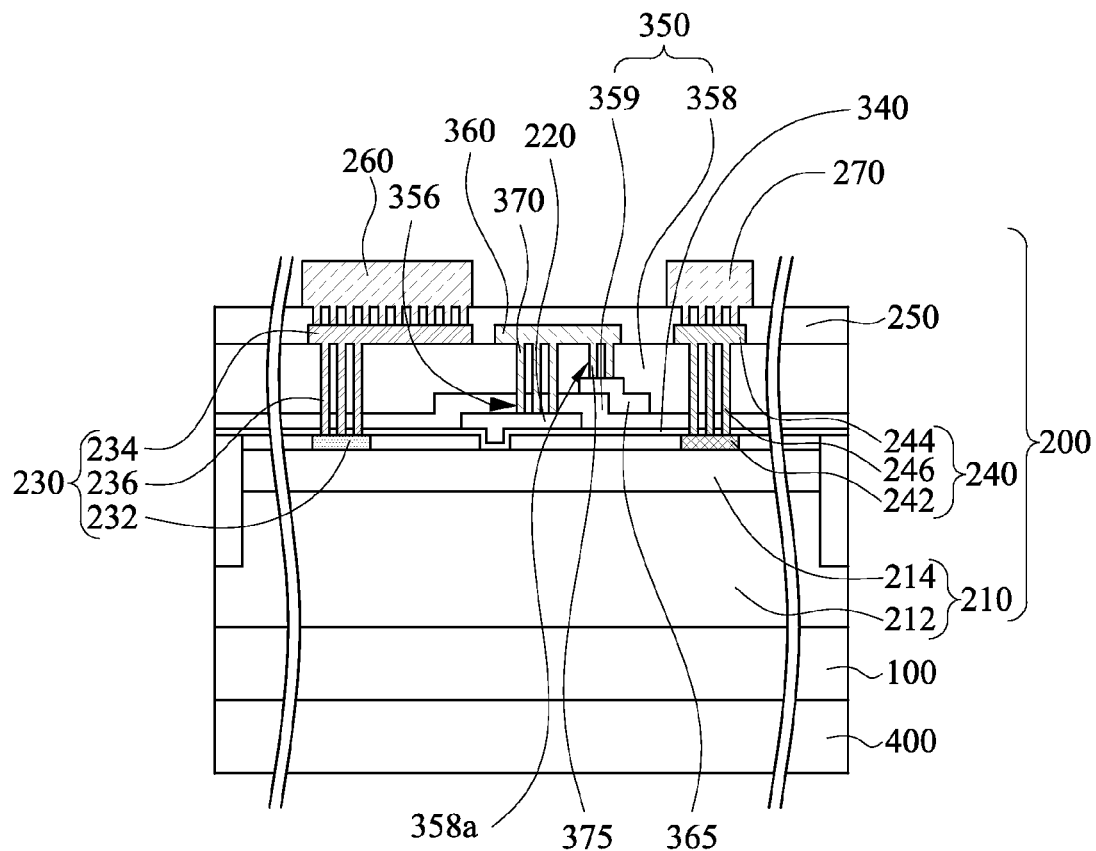
FIG. 16C is a cross-sectional view of a transistor of FIG. 1 according to yet another embodiment.

Reference is made to FIG. 16C which is a cross-sectional view of the transistor 200 of FIG. 1 according to yet another embodiment. The cross-sectional position of FIG. 16C is the same as that of FIG. 16A. The difference between the present embodiment and the embodiment of FIG. 16A pertains to the structures of the interlayer dielectric 350 and the presence of a metal layer 365 and a second inter-gate plug 375. In this embodiment, the interlayer dielectric 350 includes an upper dielectric portion 358 and a lower dielectric portion 359. The upper dielectric portion 358 has at least one second inter-gate via hole 358$a$. The lower dielectric portion 359 is disposed between the upper dielectric portion 358 and the gate dielectric layer 340. The transistor 200 further includes a metal layer 365 and at least one second inter-gate plug 375. The metal layer 365 is disposed between the upper dielectric portion 358 and the lower dielectric portion 359, and an orthogonal projection of the metal layer 365 on the active layer 210 overlaps an orthogonal projection of the inter-gate layer 360 on the active layer 210. The second inter-gate plug 375 is filled in the second inter-gate via hole 358$a$ and is electrically connected the inter-gate layer 360 and the metal layer 365. The metal layer 365 can further disperse the electric field of the ends of the gate electrode 220. In addition, since the metal layer 365 is electrically connected to the gate electrode 220 through the inter-gate layer 360, the presence of the metal layer 365 does not increase capacitance between the source electrode 230 and the drain electrode 240. Other relevant structural details of the present embodiment are all the same as the embodiment of FIG. 16A, and, therefore, a description in this regard will not be repeated hereinafter.

Figure 17:
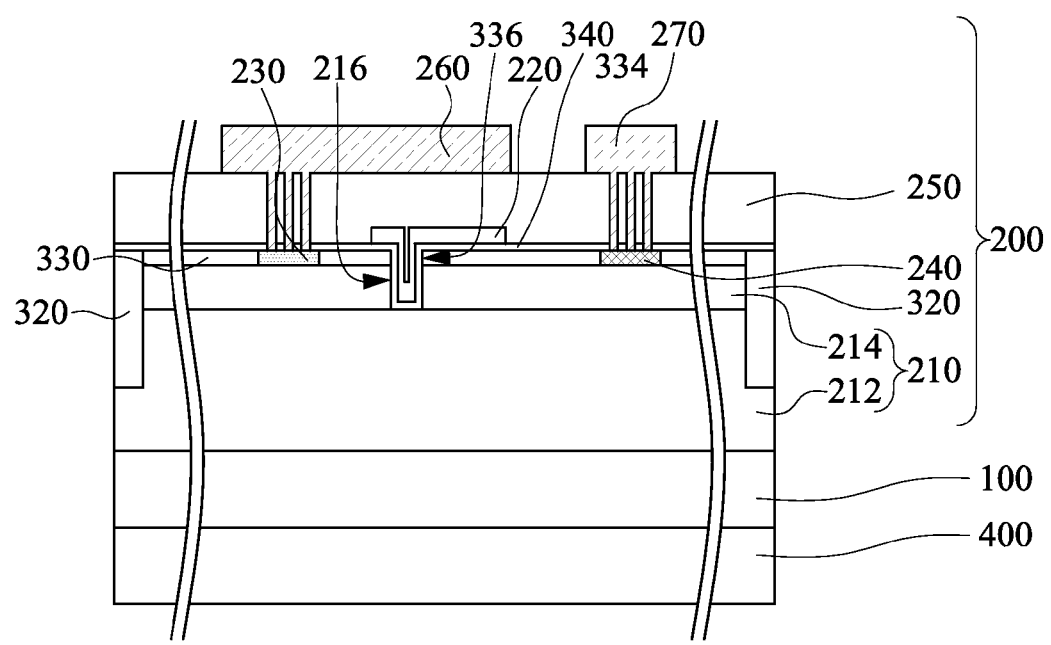
FIG. 17 is a cross-sectional view of a transistor of FIG. 1 according to yet another embodiment.

Reference is made to FIG. 17 which is a cross-sectional view of the transistor 200 of FIG. 1 according to yet another embodiment. The cross-sectional position of FIG. 17 is the same as that of FIG. 3A. The difference between the present embodiment and the embodiment of FIG. 3A pertains to the configuration of the gate electrode 220 and the active layer 210. In this embodiment, the active layer 210 has a recess 216. More specifically, the recess 216 is located in the aluminum gallium nitride layer 214. The passivation layer 330 of the transistor 200 has a gate opening 336 therein to expose the recess 216. The gate dielectric layer 340 and the gate electrode 220 cover the gate opening 336 and the recess 216. The gate electrode 220 can affect the 2DEG in the active layer 210 through the recess 216, such that in contrast to the depletion mode transistor in FIG. 3A, the transistor 200 in this embodiment is an enhancement mode transistor. Other relevant structural details of the present embodiment are all the same as the embodiment of FIG. 3A, and, therefore, a description in this regard will not be repeated hereinafter.

Figure 18:
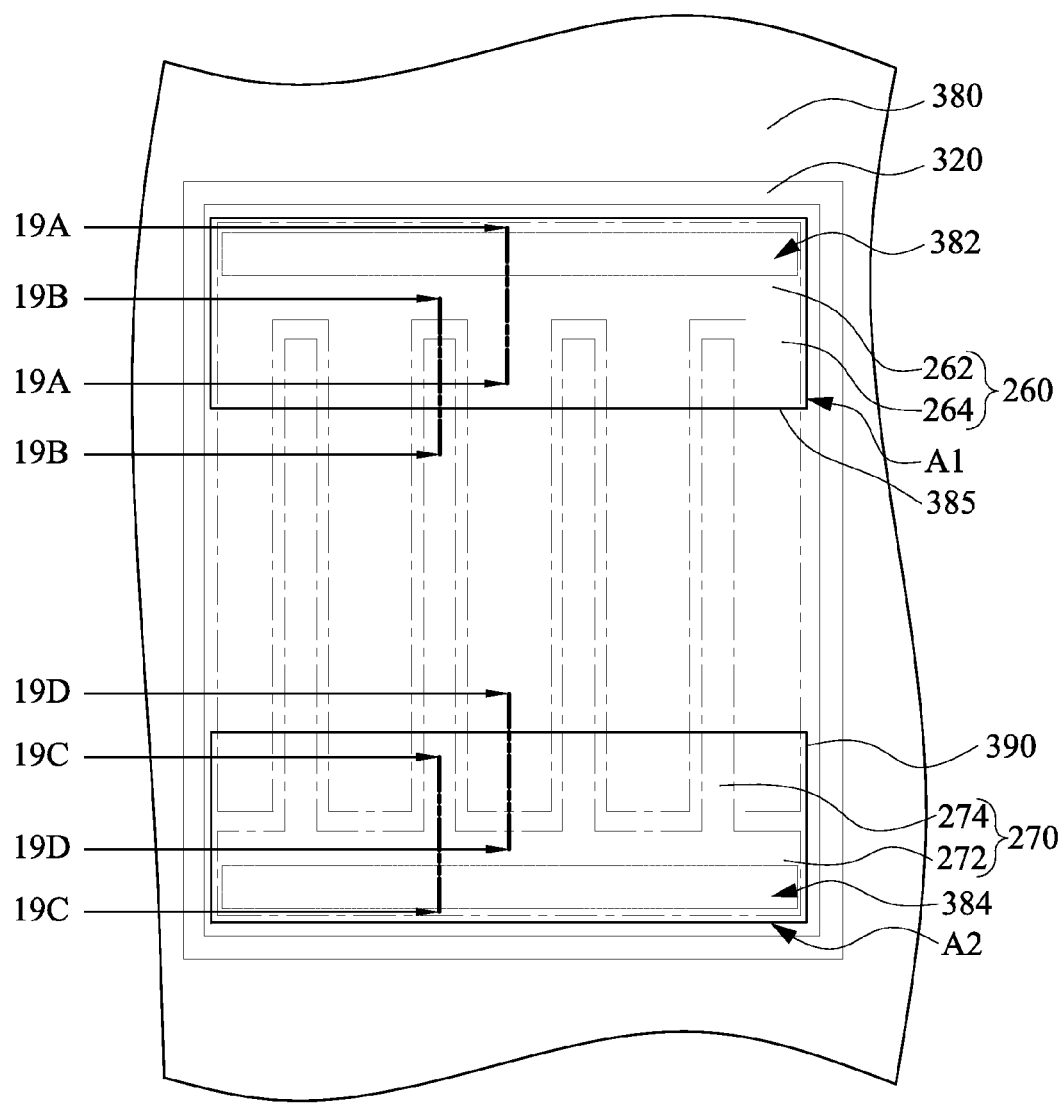
FIG. 18 is a top view of a transistor of FIG. 1 according to yet another embodiment of the present invention.
Figure 19B:
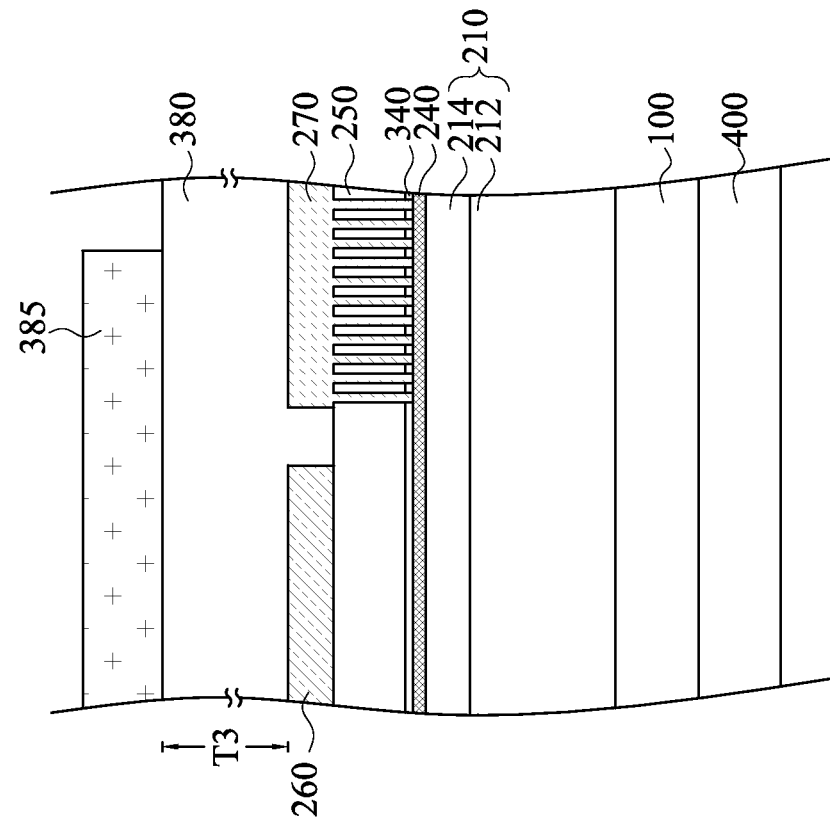
FIG. 19B is a cross-sectional view taken along line 19B-19B of FIG. 18.
Figure 19A:
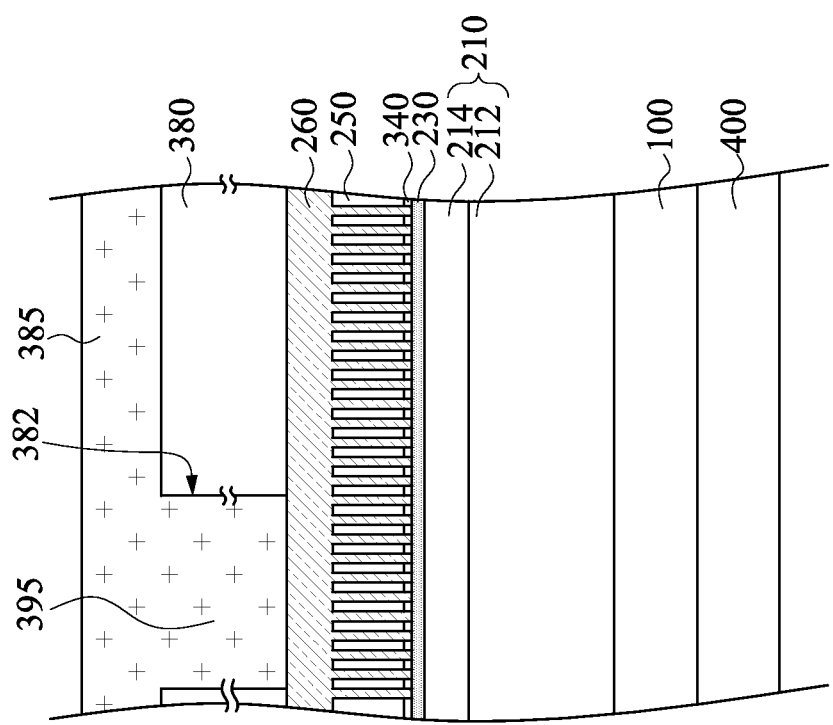
FIG. 19A is a cross-sectional view taken along line 19A-19A of FIG. 18.
Figure 19D:
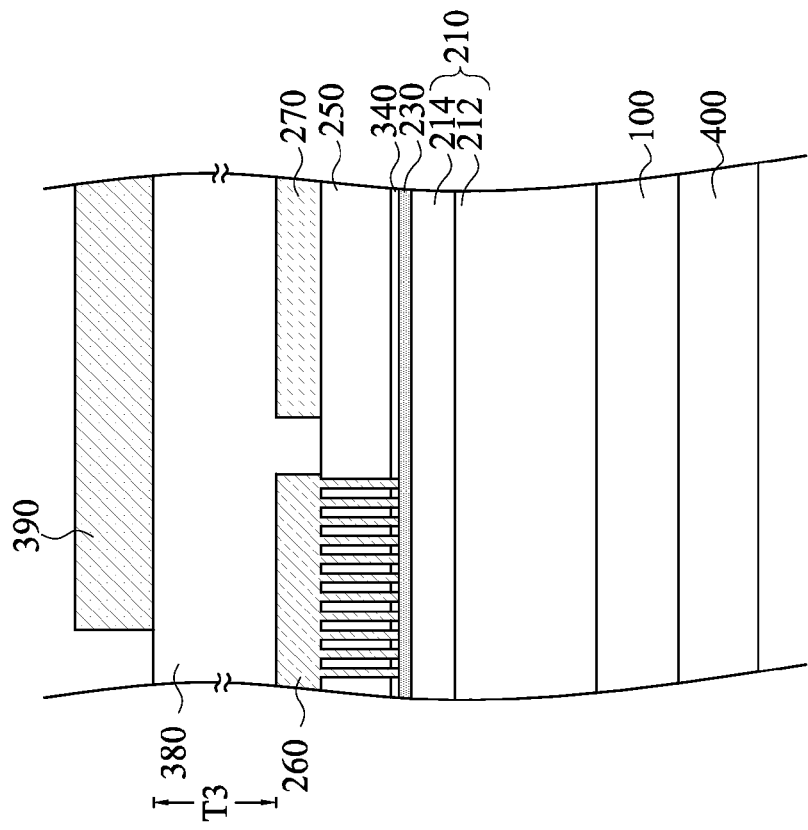
FIG. 19D is a cross-sectional view taken along line 19D-19D of FIG. 18.
Figure 19C:
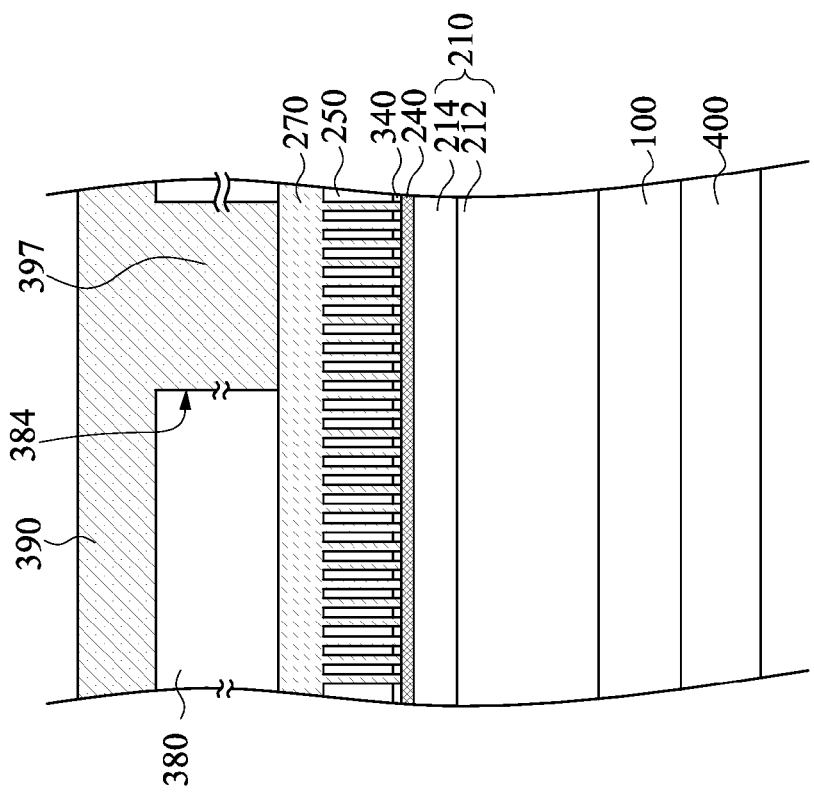
FIG. 19C is a cross-sectional view taken along line 19C-19C of FIG. 18.

FIG. 18 is a top view of a transistor 200 of FIG. 1 according to yet another embodiment of the present invention. FIG. 19A is a cross-sectional view taken along line 19A-19A of FIG. 18. FIG. 19B is a cross-sectional view taken along line 19B-19B of FIG. 18. FIG. 19C is a cross-sectional view taken along line 19C-19C of FIG. 18. FIG. 19D is a cross-sectional view taken along line 19D-19D of FIG. 18. The difference between the present embodiment and the embodiment of FIG. 2 pertains to the presence of a second insulating layer 380, a second source pad 385, a second drain pad 390, a source pad connection portion 395, and a drain pad connection portion 397. Reference is made to FIGS. 18, 19A, and 19B, in the present embodiment, the second insulating layer 380 is disposed on the first source pad 260 and the first insulating layer 250. The second insulating layer 380 has a source pad opening 382 to expose a portion of the first source pad 260, and the second insulating layer 380 has a thickness T3 greater than 7 μm. The second source pad 385 is disposed on the second insulating layer 380. The source pad connection portion 395 is disposed in the source pad opening 382 and is electrically connected to the first source pad 260 and the second source pad 385. As shown in FIG. 19A, the second source pad 385 and the first source pad 260 are electrically connected through the source pad connection portion 395. As shown in FIG. 19B, despite the parasitic capacitance generated in the overlapping region formed by the second source pad 385 and the first drain pad 270, the capacitance value of the parasitic capacitance is not large because the thickness T3 of the second insulating layer 380 is greater than 7 μm. Hence, an area of a region A1 formed by an orthogonal projection of the second source pad 385 on the active layer 210 may be greater than an area of the region formed by the orthogonal projection of the source pad body 262 on the active layer 210 to facilitate connection with external circuits.

Reference is made to FIGS. 18, 19C, and 19D. The second insulating layer 380 is further disposed on the first drain pad 270. The second insulating layer 380 further has a drain pad opening 384 to expose a portion of the first drain pad 270. The second drain pad 390 is separated from the second source pad 385 and is disposed on the second insulating layer 380. The drain pad connection portion 397 is disposed in the drain pad opening 384 and is electrically connected to the first drain pad 270 and the second drain pad 390. As shown in FIG. 19C, the second drain pad 390 and the first drain pad 270 are electrically connected through the drain pad connection portion 397. As shown in FIG. 19D, despite the parasitic capacitance generated in the overlapping region formed by the second drain pad 390 and the first source pad 260, the capacitance value of the parasitic capacitance is not large because the thickness T3 of the second insulating layer 380 is greater than 7 μm. Hence, an area of a region A2 formed by an orthogonal projection of the second drain pad 390 on the active layer 210 may be greater than an area of the region formed by the orthogonal projection of the drain pad body 272 on the active layer 210 to facilitate connection with external circuits.

In the present embodiment, a material of the second insulating layer 380 includes polyimide (PI), photoresist (PR), benzo cyclo butane (BCB), spin on glass (SOG), plastic, or their combinations. The second insulating layer 380 may be formed on the first source pad 260, the first drain pad 270, and the first insulating layer 250 by, for example, spin coating, but the invention is not limited in this respect. Other relevant structural details of the present embodiment are all the same as the embodiment of FIG. 2, and, therefore, a description in this regard will not be repeated hereinafter. It is noted that even though in this embodiment, the second insulating layer 380, the second source pad 385, the second drain pad 390, the source pad connection portion 395, and the drain pad connection portion 397 are disposed on the transistor 200 of FIG. 2, the second insulating layer 380, the second source pad 385, the second drain pad 390, the source pad connection portion 395, and the drain pad connection portion 397 can be disposed on the transistors 200 mentioned above according to actual requirements.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device package, comprising:
   a substrate;
   a transistor disposed on the substrate, comprising:
   an active layer;
   at least one source electrode disposed on the active layer, and an orthogonal projection of the source electrode on the active layer forming a source region;
   at least one drain electrode disposed on the active layer, the drain electrode separated from the source electrode, and an orthogonal projection of the drain electrode on the active layer forming a drain region;
   at least one gate electrode disposed on the active layer and between the source electrode and the drain electrode;
   a first insulating layer covering at least a portion of the source electrode and at least a portion of the drain electrode, the first insulating layer having at least one source via hole and at least one drain via hole therein;
   a first source pad disposed on the first insulating layer, and an orthogonal projection of the first source pad on the active layer forming a source pad region, the source pad region overlapping at least a portion of the drain region, and an area of overlapping region between the source pad region and the drain region being smaller than or equal to 40% of an area of the drain region;
   a first drain pad disposed on the first insulating layer;
   at least one source plug filled in the source via hole and electrically connected to the first source pad and the source electrode; and
   at least one drain plug filled in the drain via hole and electrically connected to the first drain pad and the drain electrode; and
   a lead frame disposed on a side of the substrate opposite to the transistor and electrically connected to the gate electrode.

2. The semiconductor device package of claim 1, further comprising:
   a gate pin electrically connected to the lead frame and the gate electrode; and
   a source pin and a drain pin respectively electrically connected to the source electrode and the drain electrode, and both of the source pin and the drain pin electrically insulated with the lead frame.

3. The semiconductor device package of claim 1, further comprising:
   an inter-insulating layer disposed between the lead frame and the substrate.

4. The semiconductor device package of claim 1, wherein the transistor is a depletion mode transistor; and
   wherein the semiconductor device package further comprises an enhancement mode transistor electrically connected to the depletion mode transistor.

5. The semiconductor device package of claim 1, wherein an orthogonal projection of the first drain pad of the transistor on the active layer forms a drain pad region, the drain pad region overlaps at least a portion of the source region, and an area of overlapping region between the drain pad region and the source region is smaller than or equal to 40% of an area of the source region.

6. The semiconductor device package of claim 1, wherein the transistor further comprises:
   a gate dielectric layer disposed at least between the gate electrode and the active layer;
   an interlayer dielectric covering the gate dielectric layer, and the interlayer dielectric having at least one first inter-gate via hole;
   an inter-gate layer disposed between the interlayer dielectric and the first insulating layer; and
   at least one first inter-gate plug filled in the first inter-gate via hole and electrically connected the inter-gate layer and the gate electrode.

7. The semiconductor device package of claim 6, wherein orthogonal projections of the first source pad, the first drain pad, and the gate electrode on the active layer are separated from each other.

8. The semiconductor device package of claim 6, wherein an orthogonal projection of the gate electrode on the active layer overlaps at least one of orthogonal projections of the first source pad and the first drain pad on the active layer.

9. The semiconductor device package of claim 8, wherein an area of overlapping region between the orthogonal projection of the gate electrode and one of the orthogonal projections of the first source pad and the first drain pad on the active layer is smaller than 10% of an area of the orthogonal projection of the gate electrode on the active layer.

10. The semiconductor device package of claim 6, wherein the interlayer dielectric comprises:
    an upper dielectric portion having at least one second inter-gate via hole; and
    a lower dielectric portion disposed between the upper dielectric portion and the gate dielectric layer;
    wherein the transistor further comprises:
    a metal layer disposed between the upper dielectric portion and the lower dielectric portion, and an orthogonal projection of the metal layer on the active layer overlapping an orthogonal projection of the inter-gate layer on the active layer; and
    at least one second inter-gate plug filled in the second inter-gate via hole and electrically connected to the inter-gate layer and the metal layer.

11. A semiconductor device package, comprising:
    a substrate;
    a transistor disposed on the substrate, comprising:
    an active layer;
    at least one source electrode disposed on the active layer, and an orthogonal projection of the source electrode on the active layer forming a source region;
    at least one drain electrode disposed on the active layer, the drain electrode separated from the source electrode, and an orthogonal projection of the drain electrode on the active layer forming a drain region;
    at least one gate electrode disposed on the active layer and between the source electrode and the drain electrode;
    a first insulating layer covering at least a portion of the source electrode and at least a portion of the drain electrode, the first insulating layer having at least one source via hole and at least one drain via hole therein;

a first source pad disposed on the first insulating layer, and an orthogonal projection of the first source pad on the active layer forming a source pad region, the source pad region overlapping at least a portion of the drain region, and an area of overlapping region between the source pad region and the drain region being smaller than or equal to 40% of an area of the drain region;

a first drain pad disposed on the first insulating layer;

at least one source plug filled in the source via hole and electrically connected to the first source pad and the source electrode; and at least one drain plug filled in the drain via hole and electrically connected to the first drain pad and the drain electrode; and a lead frame disposed on a side of the substrate opposite to the transistor and electrically insulated with the gate electrode, the source electrode, and the drain electrode.

12. The semiconductor device package of claim 11, further comprising:
a gate pin, a source pin, and a drain pin respectively electrically connected to the gate electrode, the source electrode, and the drain electrode.

13. The semiconductor device package of claim 11, wherein the transistor is a depletion mode transistor; and
wherein the semiconductor device package further comprises an enhancement mode transistor electrically connected to the depletion mode transistor.

14. The semiconductor device package of claim 11, wherein an orthogonal projection of the first drain pad of the transistor on the active layer forms a drain pad region, the drain pad region overlaps at least a portion of the source region, and an area of overlapping region between the drain pad region and the source region is smaller than or equal to 40% of an area of the source region.

15. The semiconductor device package of claim 11, wherein the transistor further comprises:
a gate dielectric layer disposed at least between the gate electrode and the active layer;
an interlayer dielectric covering the gate dielectric layer, and the interlayer dielectric having at least one first inter-gate via hole;
an inter-gate layer disposed between the interlayer dielectric and the first insulating layer; and
at least one first inter-gate plug filled in the first inter-gate via hole and electrically connected the inter-gate layer and the gate electrode.

16. The semiconductor device package of claim 15 wherein orthogonal projections of the first source pad, the first drain pad, and the gate electrode on the active layer are separated from each other.

17. The semiconductor device package of claim 15, wherein an orthogonal projection of the gate electrode on the active layer overlaps at least one of orthogonal projections of the first source pad and the first drain pad on the active layer.

18. The semiconductor device package of claim 17, wherein an area of overlapping region between the orthogonal projection of the gate electrode and one of the orthogonal projections of the first source pad and the first drain pad on the active layer is smaller than 10% of an area of the orthogonal projection of the gate electrode on the active layer.

19. The semiconductor device package of claim 15, wherein the interlayer dielectric comprises:
an upper dielectric portion having at least one second inter-gate via hole; and
a lower dielectric portion disposed between the upper dielectric portion and the gate dielectric layer;
wherein the transistor further comprises:
a metal layer disposed between the upper dielectric portion and the lower dielectric portion, and an orthogonal projection of the metal layer on the active layer overlapping an orthogonal projection of the inter-gate layer on the active layer; and
at least one second inter-gate plug filled in the second inter-gate via hole and electrically connected to the inter-gate layer and the metal layer.

20. A semiconductor device package, comprising:
a substrate;
a transistor disposed on the substrate, comprising:
an active layer;
at least one source electrode disposed on the active layer, and an orthogonal projection of the source electrode on the active layer forming a source region;
at least one drain electrode disposed on the active layer, the drain electrode being separated from the source electrode, and an orthogonal projection of the drain electrode on the active layer forming a drain region;
at least one gate electrode disposed on the active layer and between the source electrode and the drain electrode;
a first insulating layer covering at least a portion of the source electrode and at least a portion of the drain electrode, the first insulating layer having at least one source via hole and at least one drain via hole therein;
a first source pad disposed on the first insulating layer, and an orthogonal projection of the first source pad on the active layer forming a source pad region, the source pad region overlapping at least a portion of the drain region, and an area of overlapping region between the source pad region and the drain region being smaller than or equal to 40% of an area of the drain region;
a first drain pad disposed on the first insulating layer;
at least one source plug filled in the source via hole and electrically connected to the first source pad and the source electrode; and
at least one drain plug filled in the drain via hole and electrically connected to the first drain pad and the drain electrode; and
a lead frame disposed on a side of the substrate opposite to the transistor and electrically connected to the source electrode or the drain electrode; and
an inter-insulating layer disposed between the substrate and the lead frame.

21. The semiconductor device package of claim 20, further comprising:
a gate pin electrically connected to the gate electrode; and
a source pin and a drain pin respectively electrically connected to the source electrode and the drain electrode, and one of the source pin and the drain pin electrically connected to the lead frame.

22. The semiconductor device package of claim 20, wherein the transistor is a depletion mode transistor; and
wherein the semiconductor device package further comprises an enhancement mode transistor electrically connected to the depletion mode transistor.

23. The semiconductor device package of claim 20, wherein an orthogonal projection of the first drain pad of the transistor on the active layer forms a drain pad region, the drain pad region overlaps at least a portion of the source region, and an area of overlapping region between the drain pad region and the source region is smaller than or equal to 40% of an area of the source region.

24. The semiconductor device package of claim 20, wherein the transistor further comprises:
   a gate dielectric layer disposed at least between the gate electrode and the active layer;
   an interlayer dielectric covering the gate dielectric layer, and the interlayer dielectric having at least one first inter-gate via hole;
   an inter-gate layer disposed between the interlayer dielectric and the first insulating layer; and
   at least one first inter-gate plug filled in the first inter-gate via hole and electrically connected the inter-gate layer and the gate electrode.

25. The semiconductor device package of claim 24, wherein orthogonal projections of the first source pad, the first drain pad, and the gate electrode on the active layer are separated from each other.

26. The semiconductor device package of claim 24, wherein an orthogonal projection of the gate electrode on the active layer overlaps at least one of orthogonal projections of the first source pad and the first drain pad on the active layer.

27. The semiconductor device package of claim 26, wherein an area of overlapping region between the orthogonal projection of the gate electrode and one of the orthogonal projections of the first source pad and the first drain pad on the active layer is smaller than 10% of an area of the orthogonal projection of the gate electrode on the active layer.

28. The semiconductor device package of claim 24, wherein the interlayer dielectric comprises:
   an upper dielectric portion having at least one second inter-gate via hole; and
   a lower dielectric portion disposed between the upper dielectric portion and the gate dielectric layer;
   wherein the transistor further comprises:
   a metal layer disposed between the upper dielectric portion and the lower dielectric portion, and an orthogonal projection of the metal layer on the active layer overlapping an orthogonal projection of the inter-gate layer on the active layer; and
   at least one second inter-gate plug filled in the second inter-gate via hole and electrically connected to the inter-gate layer and the metal layer.

29. A semiconductor device package, comprising:
   a substrate;
   a transistor disposed on the substrate, comprising:
      an active layer;
      at least one source electrode disposed on the active layer, and an orthogonal projection of the source electrode on the active layer forming a source region;
      at least one drain electrode disposed on the active layer, the drain electrode separated from the source electrode, and an orthogonal projection of the drain electrode on the active layer forming a drain region;
      at least one gate electrode disposed on the active layer and between the source electrode and the drain electrode;
      a first insulating layer covering at least a portion of the source electrode and at least a portion of the drain electrode, the first insulating layer having at least one source via hole and at least one drain via hole therein;
      a first source pad disposed on the first insulating layer, and an orthogonal projection of the first source pad on the active layer forming a source pad region, the source pad region overlapping at least a portion of the drain region, and an area of overlapping region between the source pad region and the drain region being smaller than or equal to 40% of an area of the drain region;
      a first drain pad disposed on the first insulating layer;
      at least one source plug filled in the source via hole and electrically connected to the first source pad and the source electrode; and
      at least one drain plug filled in the drain via hole and electrically connected to the first drain pad and the drain electrode; and
   a lead frame, the transistor electrically connected to the lead frame using a flip-chip configuration, the lead frame comprising:
      a first portion electrically connected to the gate electrode;
      a second portion electrically connected to the source electrode; and
      a third portion electrically connected to the drain electrode.

30. The semiconductor device package of claim 29, wherein the transistor is a depletion mode transistor; and
   wherein the semiconductor device package further comprises an enhancement mode transistor electrically connected to the depletion mode transistor.

31. The semiconductor device package of claim 29, wherein an orthogonal projection of the first drain pad of the transistor on the active layer forms a drain pad region, the drain pad region overlaps at least a portion of the source region, and an area of overlapping region between the drain pad region and the source region is smaller than or equal to 40% of an area of the source region.

32. The semiconductor device package of claim 29, wherein the transistor further comprises:
   a gate dielectric layer disposed at least between the gate electrode and the active layer;
   an interlayer dielectric covering the gate dielectric layer, and the interlayer dielectric having at least one first inter-gate via hole;
   an inter-gate layer disposed between the interlayer dielectric and the first insulating layer; and
   at least one first inter-gate plug filled in the first inter-gate via hole and electrically connected the inter-gate layer and the gate electrode.

33. The semiconductor device package of claim 32, wherein orthogonal projections of the first source pad, the first drain pad, and the gate electrode on the active layer are separated from each other.

34. The semiconductor device package of claim 32, wherein an orthogonal projection of the gate electrode on the active layer overlaps at least one of orthogonal projections of the first source pad and the first drain pad on the active layer.

35. The semiconductor device package of claim 34, wherein an area of overlapping region between the orthogonal projection of the gate electrode and one of the orthogonal projections of the first source pad and the first drain pad on the active layer is smaller than 10% of an area of the orthogonal projection of the gate electrode on the active layer.

36. The semiconductor device package of claim 32, wherein the interlayer dielectric comprises:
   an upper dielectric portion having at least one second inter-gate via hole; and
   a lower dielectric portion disposed between the upper dielectric portion and the gate dielectric layer;
   wherein the transistor further comprises:
   a metal layer disposed between the upper dielectric portion and the lower dielectric portion, and an orthogonal projection of the metal layer on the active layer overlapping an orthogonal projection of the inter-gate layer on the active layer; and at least one second inter-gate plug filled in the second inter-gate via hole and electrically connected to the inter-gate layer and the metal layer.

\* \* \* \* \*